United States Patent
Knaapen et al.

(10) Patent No.: US 9,567,671 B2
(45) Date of Patent: Feb. 14, 2017

(54) METHOD AND APPARATUS FOR DEPOSITING ATOMIC LAYERS ON A SUBSTRATE

(75) Inventors: Raymond Jacobus Wilhelmus Knaapen, Delft (NL); Ruud Olieslagers, Delft (NL); Dennis Van Den Berg, Delft (NL); Matijs C. Van Den Boer, Delft (NL); Diederik Jan Maas, Delft (NL); Jacques Cor Johan Van Der Donck, Delft (NL); Freddy Roozeboom, Delft (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 0 days.

(21) Appl. No.: 14/237,577

(22) PCT Filed: Jul. 30, 2012

(86) PCT No.: PCT/NL2012/050540
§ 371 (c)(1),
(2), (4) Date: May 14, 2014

(87) PCT Pub. No.: WO2013/022339
PCT Pub. Date: Feb. 14, 2013

(65) Prior Publication Data
US 2015/0086715 A1  Mar. 26, 2015

(30) Foreign Application Priority Data

Aug. 10, 2011  (EP) ..................... 11177166

(51) Int. Cl.
*C23C 16/455*  (2006.01)
*C23C 16/44*  (2006.01)
(Continued)

(52) U.S. Cl.
CPC ..... *C23C 16/45589* (2013.01); *C23C 16/4401* (2013.01); *C23C 16/4409* (2013.01);
(Continued)

(58) Field of Classification Search
None
See application file for complete search history.

(56) References Cited

U.S. PATENT DOCUMENTS

2004/0067641 A1  4/2004  Yudovsky
2005/0172897 A1  8/2005  Jansen
(Continued)

FOREIGN PATENT DOCUMENTS

| CN | 101406108 A | 4/2009 |
|---|---|---|
| CN | 101415860 A | 4/2009 |
| EP | 2360293 A1 | 8/2011 |

OTHER PUBLICATIONS

International Search Report—PCT/NL2012/050540—Mailing date: Jan. 28, 2013.
(Continued)

*Primary Examiner* — Joseph Miller, Jr.
(74) *Attorney, Agent, or Firm* — Banner & Witcoff, Ltd.

(57) ABSTRACT

Method of depositing an atomic layer on a substrate. The method comprises supplying a precursor gas from a precursor-gas supply of a deposition head that may be part of a rotatable drum. The precursor gas is provided from the precursor-gas supply towards the substrate. The method further comprises moving the precursor-gas supply by rotating the deposition head along the substrate which in its turn is moved along the rotating drum. The method further comprises switching between supplying the precursor gas from the precursor-gas supply towards the substrate over a first part of the rotation trajectory; and interrupting supply-
(Continued)

ing the precursor gas from the precursor-gas supply over a second part of the rotation trajectory.

19 Claims, 25 Drawing Sheets

(51) Int. Cl.
C23C 16/458 (2006.01)
C23C 16/52 (2006.01)
C23C 16/54 (2006.01)

(52) U.S. Cl.
CPC ...... *C23C 16/4586* (2013.01); *C23C 16/4588* (2013.01); *C23C 16/45517* (2013.01); *C23C 16/45525* (2013.01); *C23C 16/45536* (2013.01); *C23C 16/45551* (2013.01); *C23C 16/45578* (2013.01); *C23C 16/45587* (2013.01); *C23C 16/52* (2013.01); *C23C 16/545* (2013.01)

(56) References Cited

U.S. PATENT DOCUMENTS

| 2007/0224348 A1 | 9/2007 | Dickey et al. |
| 2007/0238311 A1 | 10/2007 | Levy |
| 2011/0076421 A1* | 3/2011 | Lee ................. C23C 16/045 427/569 |

OTHER PUBLICATIONS

P.S. Maydannik et al: "An atomic layer deposition process for moving flexible substrates", Chemical Engineering Journal. vol. 171. No. 1. Jun. 1, 2011 (Jun. 1, 2011). pp. 345-349. XP055016206. ISSN: 1385-8947.

Paul Poodt: "Review Article: Spatial atomic layer deposition: A route towards further industrialization of atomic layer deposition", J. Vac. Sci. Technol., vol. 30. No. 1. Dec. 14, 2011 (Dec. 14, 2011). p. 010802-1. XP002666916.

* cited by examiner

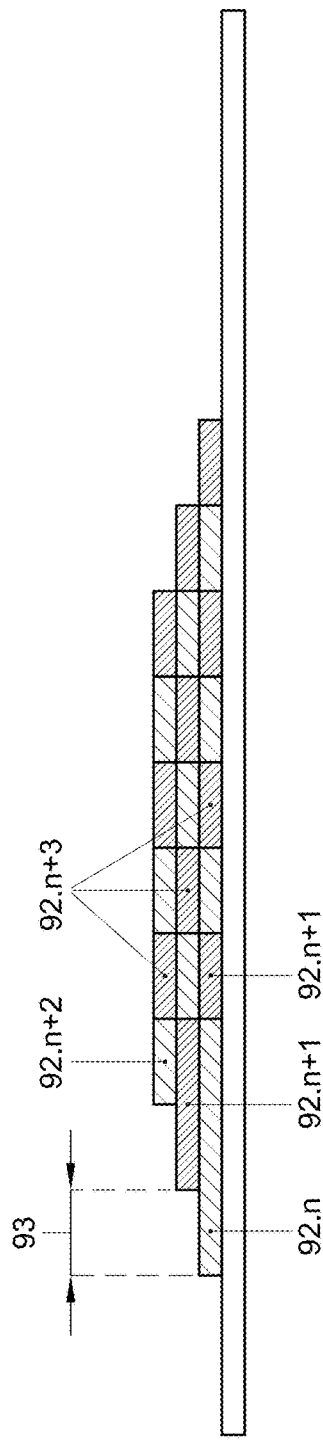
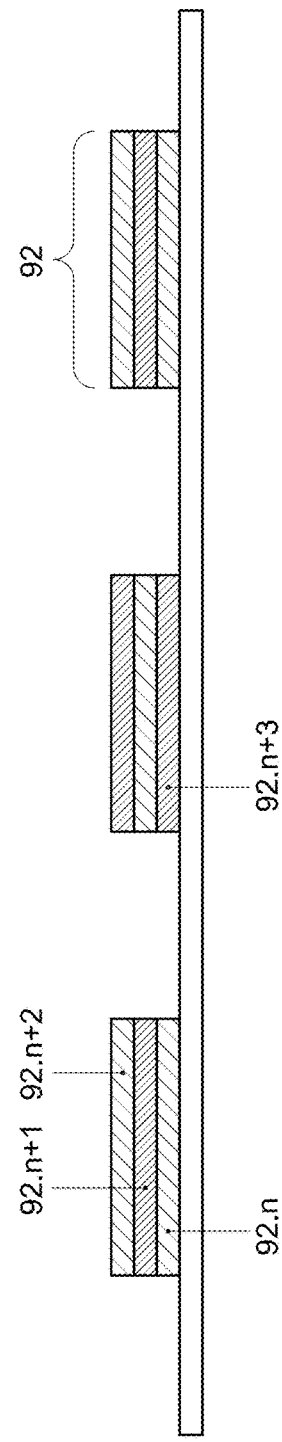

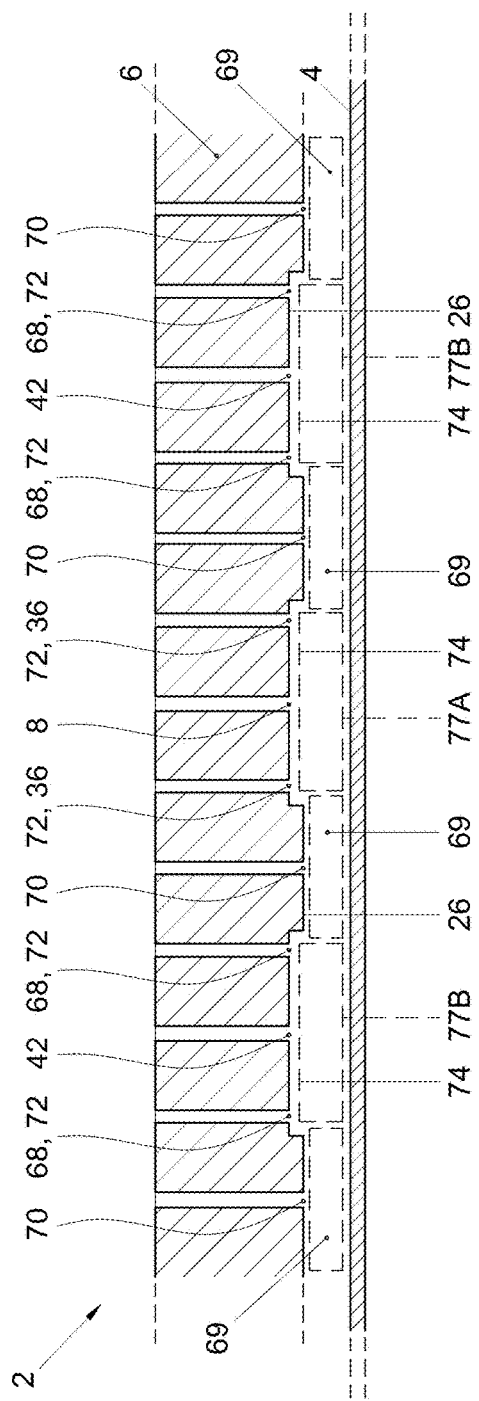
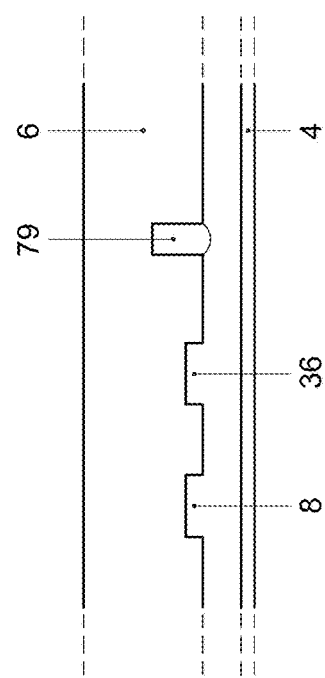
Fig. 6
Fig. 6A

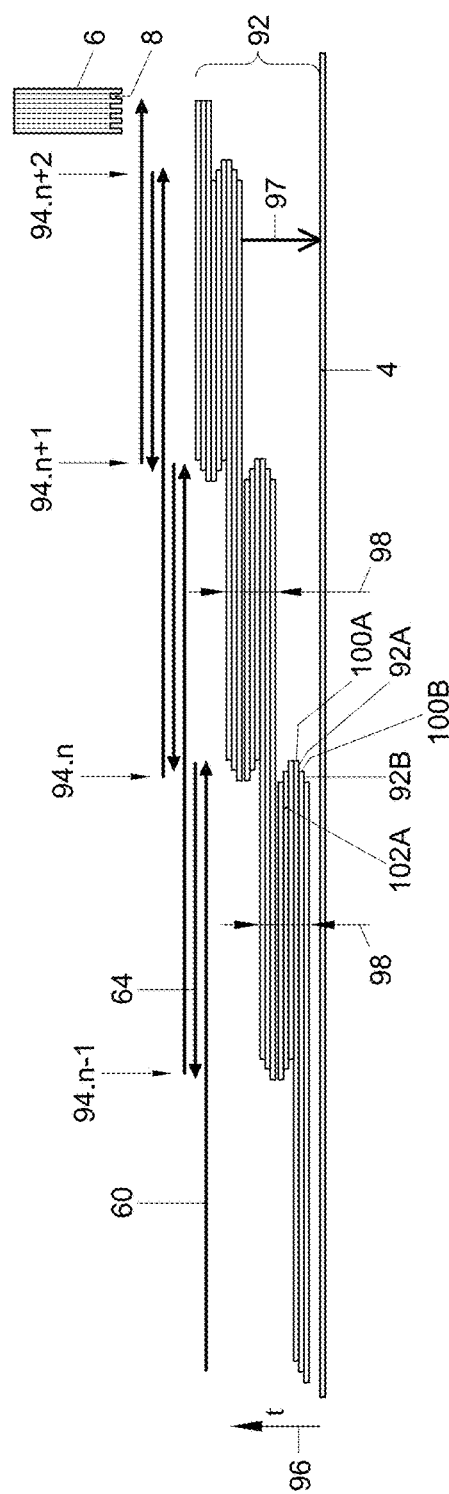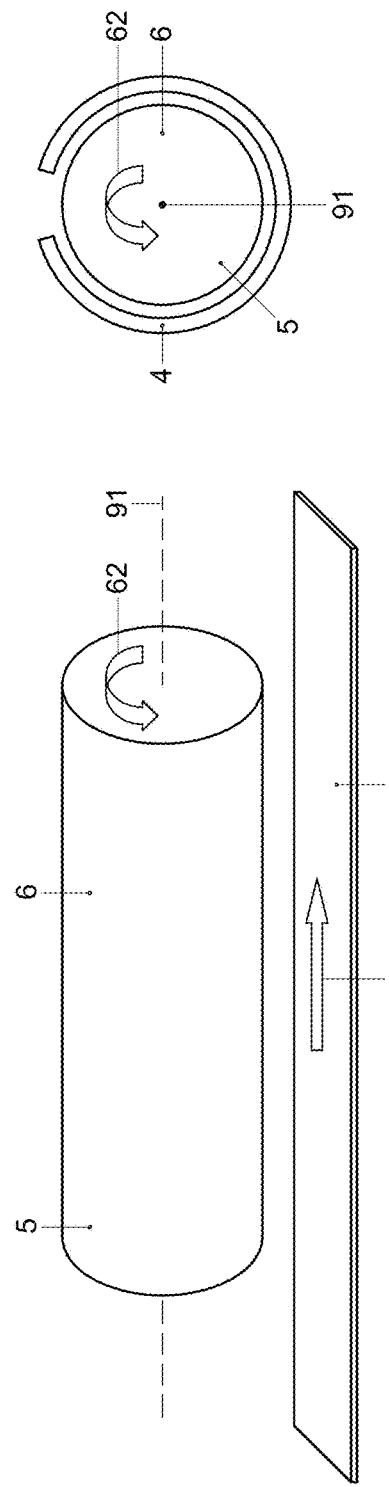
Fig. 10
Fig. 11A
Fig. 11B

METHOD AND APPARATUS FOR DEPOSITING ATOMIC LAYERS ON A SUBSTRATE

CROSS-REFERENCE TO RELATED APPLICATIONS

This application is a U.S. National Stage application under 35 U.S.C. §371 of International Application PCT/NL2012/050540 (published as WO 2013/022339 A1), filed Jul. 30, 2012, which claims priority to Application EP 11177166.3, filed Aug. 10, 2011. Benefit of the filing date of each of these prior applications is hereby claimed. Each of these prior applications is hereby incorporated by reference in its entirety.

The invention relates to a method of depositing an atomic layer, preferably a stack of atomic layers, on a substrate, which method comprises supplying a precursor gas from a precursor-gas supply comprised by a deposition head towards the substrate. The invention also relates to an apparatus for depositing an atomic layer on a substrate, the apparatus comprising a deposition head having a precursor-gas supply for supplying a precursor gas towards the substrate. The invention also relates to the stack of atomic layers.

Atomic layer deposition is known as a method for depositing a monolayer of target material. Atomic layer deposition differs from for example chemical vapor deposition in that atomic layer deposition takes at least two consecutive process steps (i.e. half-cycles). A first one of these self-limited process steps comprises application of a precursor gas on a substrate's surface. A second one of these self-limited process steps comprises reaction of the precursor material in order to form the monolayer of target material. Atomic layer deposition has the advantage of enabling excellent if not ideal layer thickness control. However, atomic layers are essentially thin. As a result, application of atomic layer deposition for depositing layers with a certain thickness larger than about 10 nanometers usually is rather time-consuming, because numerous atomic layers need to be stacked for obtaining such a layer thickness.

WO2007/106076 describes a method of atomic layer deposition wherein a substrate is mounted on a drum. This drum is rotated along a nozzle that supplies a precursor gas. In this way, multiple layer atomic layers can be deposited in a rather short time. However, the method of WO2007/106076 can only be applied on a substrate that has a length equal to or smaller than a circumference of the drum. In addition, the time necessary for mounting the substrate to the drum may at least partly or even completely undo the time gained by rotating the substrate rapidly along the nozzle.

US2011/0076421 describes a vapor deposition reactor that may be inserted into a tube in which a thin film is to be deposited. The vapor deposition reactor may be rotated with the tube fixed. Rotating the vapor deposition reactor while the substrate only partly covers the circumference of the vapor deposition reactor may lead to leakage of reactant.

EP2360293 by the present inventors discloses a method of depositing an atomic layer on a substrate. The method comprises supplying a precursor gas from a precursor-gas supply of a deposition head that may be part of a rotatable drum. The precursor gas is provided from the precursor-gas supply towards the substrate. The method further comprises moving the precursor-gas supply by rotating the deposition head along the substrate which in its turn is moved along the rotating drum. In EP2360293 a sealing element is provided to prevent precursor gas from leaking away to an outer environment.

It is an objective of the invention to provide a method of depositing an atomic layer that at least partly meets one or more of the problems of known methods.

Accordingly, the invention provides a method of depositing an atomic layer, preferably a stack of atomic layers, on a, e.g. flexible or rigid, substrate, which method comprises supplying a precursor gas from a precursor-gas supply, preferably from a plurality of precursor-gas supplies, comprised by a deposition head towards the substrate, comprises having the precursor gas react near, e.g. on, the substrate so as to form an atomic layer, comprises moving the precursor-gas supply along the substrate by rotating the deposition head along a rotation trajectory while supplying the precursor gas, and further comprises switching between supplying the precursor gas from the precursor-gas supply towards the substrate over a first part of the rotation trajectory; and interrupting supplying the precursor gas from said precursor-gas supply over a second part of the rotation trajectory.

In this way, a stack of atomic layers can be deposited while continuously moving (e.g. rotating or revolving) the precursor-gas supply and/or the substrate. As a result, a deposition rate of the atomic layers can be increased. Furthermore, by switching between supplying and interrupting the precursor gas, an undesired leakage of precursor gas may be prevented over a second part of the rotation trajectory, e.g. when the substrate is removed or away from the output face.

In an embodiment, the deposition head may be rotated continuously in one direction, while supplying the precursor gas. Thus, moving the precursor-gas supply and/or the substrate in a reciprocating manner may be avoided when depositing the stack of atomic layers. In this way back-turning of the precursor head and/or the substrate, being inherent to reciprocating motion, can be prevented. This may lead to a higher deposition rate and/or a more even atomic layer deposition, e.g. because there is no seam at a turning point of the deposition head.

In another embodiment, the deposition head may be rotated in a reciprocating motion while supplying the precursor gas. E.g. the deposition head is first moved in one direction while supplying the precursor gas and then moved in another direction while supplying the precursor gas. An advantage of this embodiment may be a higher flexibility in the deposition process, e.g. less precursor gas supplies may be required.

It is noted that US 2009/0081885 A1 does not disclose moving the precursor-gas supply along the substrate by rotating the deposition head while supplying the precursor gas. US 2009/0081885 A1 does also not disclose that thus a stack of atomic layers is deposited while continuously moving (e.g. rotating) the precursor-gas supply in one direction. The apparatus disclosed in US 2009/0081885 A1 is unsuitable for continuously rotating the precursor-gas supply in one direction while supplying the precursor gas.

The substrate may be a flexible substrate or a rigid, i.e. inflexible, substrate. Using a flexible substrate combines well with the rotating deposition head. Such a flexible substrate allows for bending the substrate which facilitates guiding the substrate around the rotating deposition head.

In an embodiment, the method comprises moving the substrate along the precursor-gas supply subsequently to and/or simultaneously with supplying the precursor gas towards the substrate. Moving the substrate along the precursor-gas supply subsequently to supplying the precursor gas towards the substrate enables the deposition of mutually isolated regions where stacked layers are deposited on the substrate. Moving the substrate along the precursor-gas supply simultaneously with supplying the precursor gas towards the substrate enables a rather continuous stacked layer that is built from atomic layers that are offset with respect to each other, i.e. that partially overlap. In this way, a seam between edges of atomic layers that extends perpendicularly to the substrate can substantially be prevented. The translational velocity of the precursor-gas supply relative to the substrate may be constant in time or may be varied in time.

In an embodiment, during depositing the atomic layer, the translational velocity of the precursor-gas supply is larger than and/or is directed against a translation velocity of the substrate. This further increases a deposition rate of the atomic layers. For example, an absolute value of the translational velocity of the precursor-gas supply can be at least 5 times, at least 10 times, at least 20 times, at least 50 times, at least 100 times, at least 500 times, at least 1000 times, at least 5000 times, and/or at least 10000 times larger than an absolute value of the translational velocity of the substrate. In an embodiment the substrate may be moved very slowly or held still while the precursor head moves along the substrate surface thus depositing any desired number of layers. It may be clear that optionally the translational velocity of the precursor-gas supply may be directed in a direction of the translational velocity of the substrate.

In an embodiment, the precursor-gas supply is shaped in elongated form along, or inclined to, an axial direction of the deposition head, wherein the precursor-gas supply and/or the substrate are moved in a direction that is transverse to the axial direction defined by the rotating head movement. Such an elongated precursor-gas supply formed along or inclined to the axial direction may enable a homogeneous deposition of the atomic layer on the substrate.

In an embodiment, the deposition head has an output face that at least partly faces the substrate during depositing the atomic layer, the output face being provided with the precursor-gas supply. Hence, the precursor-gas supply may extend, along a curved output face, in a direction along or inclined with the axis of rotation of the deposition head.

In an embodiment, the output face has a substantially rounded, typically a substantially cylindrical or conical, e.g. frustoconical, shape and/or frustum shape, defining a movement path of the substrate. Hence, the output face may have a substantially cylindrical, conical, or frustum shape. Such an output face combines well with a rotating precursor head, because it enables maintaining, in use, a rather constant separation distance between the precursor head and the substrate.

It is noted that US 2007/0281089 A1 does not disclose a deposition head having an output face that: at least partly faces the substrate during depositing the atomic layer, is provided with the precursor-gas supply, and has a substantially rounded shape that defines a movement path of the substrate. It is further noted that US 2007/0281089 A1 does also not disclose a precursor-gas supply that is shaped in elongated form along, or inclined to, an axial direction of the deposition head, and does also not disclose that the precursor-gas supply may extend, along a curved output face, in a direction along or inclined with the axis of rotation of the deposition head. Instead, US 2007/0281089 A1 discloses an apparatus wherein an output face and a precursor-gas supply extend perpendicular to the axial direction and the axis of rotation. This hinders homogeneous deposition on the substrate. For example, deposition close to the axis of rotation will be different from deposition further away from the axis of rotation. Furthermore, at the position of the axis of rotation no deposition is possible. As a result, in US 2007/0281089 A1 the substrate is moved only over less than half of an area of an output face.

In an embodiment, moving the substrate along the precursor-gas supply comprises moving the substrate, preferably at least once or less than once, around the deposition head, preferably around the output face of the deposition head. Preferably, a first part of the substrate that is to be moved around the rotating deposition head at least once is located besides a second part of the substrate that has moved around the rotating substrate one time more than the first part of the substrate. Preferably, the first and second part of the substrate extend along the same line that is directed along the first and second part of the substrate and transverse to a moving direction of the substrate. In this way, the rotating precursor-gas supply may in use constantly face the substrate. As a result, leakage of the precursor gas can substantially be prevented. Hence, in this embodiment the problem of leakage (which may result in undesired reaction of precursor giving rise to contamination and particles) that may occur near a position where the substrate moves towards and reaches the deposition head, and/or near a position where the substrate moves away from and leaves the deposition head, may at least partly be solved. It is noted, that a number of times that the substrate is provided around the deposition head is not necessarily an integer.

In an embodiment, the method comprises draining the precursor gas that has leaked through a gap between the first and second part of the substrate.

In an embodiment, moving the substrate along the precursor-gas supply comprises moving the substrate along a helical path around the deposition head. The deposition head may be part of a rotatable drum. The drum may comprise a rotatable wheel with the deposition head attached thereto. The substrate may be moved along the helical path at least once around the deposition head and/or around the drum. In this way, it may be realized that the rotating precursor-gas supply may in use constantly face the substrate to provide a homogenous layer preferably over substantially the entire substrate area between opposed sides along the helical path. Specifically, the substrate may be positioned, in the helical path configuration, wherein opposed substrate sides face each other in such a way that no slit or only a very narrow slit is formed as a transition between the opposed substrate sides. In this way leakage may be substantially prevented and/or be substantially minimized.

In an embodiment, the substrate substantially faces the whole precursor-gas supply. Thus, in use, the rotating precursor-gas supply may constantly face the substrate.

In an embodiment, the method comprises confining the precursor gas by means of a cover that faces the deposition head outside locations where the substrate faces the deposition head. By means of the cover, flow of precursor gas to an outer environment of an apparatus with which the method can be carried out, may be substantially hindered or even prevented. The cover may extend along and/or in the gap between the first and second part of the substrate.

In an embodiment, the method comprises maintaining a separation distance between the substrate and the rotating deposition head. In this way, mechanical contact between the substrate and the rotating deposition head may be prevented. As a result, the translational velocity of the precursor-gas supply can be larger than and/or directed against the translational velocity of the substrate. Preferably, the separation distance is substantially constant around at least a part, and preferably all, of the circumference of the separation head.

In an embodiment, the method comprises attaching the substrate to a carrier and moving the carrier along the precursor-gas supply. By means of the carrier, the separation distance between the substrate and the rotating deposition head may be maintained. As a result, mechanical contact between the substrate and the rotating deposition head may be prevented. Preferably, the carrier comprises a mesh.

In an embodiment, the method comprises moving the carrier around a guide along a transportation face of the guide that is conformal with the output face and is facing the output face. By means of the conformal transportation face, the separation distance can be kept substantially constant over at least part of the output face.

In an embodiment, the method comprises supplying a bearing gas between the deposition head and the substrate for forming a gas-bearing layer that separates the substrate and the deposition head. In this way, a rather narrow separation distance between the rotating deposition head and the substrate may be maintained. The separation distance may e.g. be at most 200 micrometers, at most 100 micrometers, at most 15 micrometers, or at most 10 micrometers, e.g. around 5 micrometers. At the same time, the separation distance may be at least 3 micrometers, at least 5 micrometers, or at least 10 micrometers. Such small separation distances decrease an amount of excess precursor gas that is provided towards the substrate. This may be worthwhile as the precursor gas usage may usually add to production costs.

In an embodiment, the method comprises having the precursor gas react near, e.g. on, the substrate so as to form the atomic layer by selectively treating the deposited precursor material by means of a laser. Such selective treating may comprise controlling the laser for selectively treating the deposited precursor material. Selectively controlling the laser may comprise selectively controlling an intensity of the laser, e.g. turning the laser on and off to provide a raster type patterning. In such an embodiment, a laser switching time in conjunction with a relative velocity defines a pixel grid which can define very small in-plane patterning structures of for example 50 micrometers, or even less. Alternatively, selectively controlling the laser may comprise selectively diverting a beam of the laser away from the deposited precursor material. In this way, a patterned atomic layer may be deposited. E.g., when a part of the substrate where, according to an intended pattern, an atomic layer is to be deposited is adjacent to the reactant-gas supply, the laser may be turned on. E.g., when a part of the substrate where, according to the intended pattern, an atomic layer is not to be deposited is adjacent to the reactant-gas supply, the laser may be turned off. Preferably, the laser is comprised by, e.g. integrated in, the deposition head.

In an embodiment, the method comprises supplying the bearing gas from a bearing-gas supply of the deposition head towards the substrate for providing the gas-bearing layer.

In an embodiment, the method comprises supplying the precursor gas by means of the precursor-gas supply in a cavity that is defined in the deposition head and is facing the substrate, and draining the precursor gas by means of a precursor-gas drain of the deposition head from the cavity for substantially preventing precursor gas to escape from the cavity, the method further comprising supplying the bearing gas by means of the bearing-gas supply at a distance from the cavity.

Such a cavity makes it possible to apply process conditions in the cavity that are different from process conditions in the gas-bearing layer. Preferably, the precursor-gas supply and/or the precursor-gas drain are positioned in the cavity. In the gas-bearing layer, i.e. near or adjacent to the bearing-gas supply, the separation distance may be at least 3 micrometers, at least 5 micrometers, at least 10 micrometers, and/or at most 15 micrometers. In the cavity the separation distance may be at most 500 micrometers, at most 200 micrometers, at most 100 micrometers, at most 50 micrometers, and/or at least 25 micrometers. Hence, the separation distance in the cavity may be in a range from 25 micrometers to at most 500 micrometers.

The inventor recognized that the features of this embodiment may be applied more broadly, optionally in combination with one or more of the other embodiments and/or features described herein. Accordingly there is provided a method of depositing an atomic layer, preferably a stack of atomic layers, on a substrate, which method comprises supplying a precursor gas from a precursor-gas supply, preferably a plurality of precursor-gas supplies, comprised by a deposition head towards the substrate, and further comprises realizing relative motion between the precursor-gas supply and the substrate, wherein the method comprises supplying the precursor gas by means of the precursor-gas supply in a cavity that is defined in the deposition head and is facing the substrate, and comprises draining the precursor gas by means of a precursor-gas drain of the deposition head from the cavity for substantially preventing precursor gas to escape from the cavity, the method further comprising supplying the bearing gas by means of the bearing-gas supply at a distance from the cavity.

Preferably, this method comprises having the precursor gas react near, e.g. on, the substrate so as to form the atomic layer. Preferably, this method is employed for manufacture of a photovoltaic panel or a part thereof. Preferably, the atomic layer is part of the photovoltaic panel or the part thereof. For example, the atomic layer may be part of a physical passivation layer, such as an aluminum oxide ($Al_2O_3$) layer. Alternatively, the atomic layer may be part of a layer that is different from a medium-k aluminum oxide ($Al_2O_3$) layer. For example, the atomic layer may be part of an antireflection layer, such as a silicon nitride ($Si_3N_4$) layer. The method may optionally include having the precursor gas react near, e.g. on, the substrate so as to form the atomic layer without exposing a monolayer of deposited precursor material to a plasma. Preferably, the precursor-gas supply and the precursor-gas drain are positioned in the cavity.

In an embodiment, the method is used for modifying a surface energy (e.g. hydrophobicity) of the substrate by means of the atomic layer. The method may e.g. be used for modifying the surface energy of a sheet of paper or a sheet of textile. The modification may be e.g. be followed by adding a layer on the substrate having the modified surface energy, e.g. by means of printing or photolithography. Such methods may benefit from a well-defined surface energy that may be enabled by atomic layer deposition.

In an embodiment, the method comprises draining the precursor gas through the precursor-gas drain of the deposition head.

In an embodiment, the output face is provided with the cavity, the precursor-gas drain and/or the bearing-gas supply.

In an embodiment, the method comprises depositing a stack of atomic layers on the substrate, and comprises realizing relative reciprocating motion between the precursor-gas supply and the substrate, which reciprocating motion comprises back-turning a direction of motion between the precursor-gas supply and the substrate at two subsequent back-turning positions, wherein an atomic layer deposited between the back-turning positions is offset with respect to a previously deposited atomic layer. In this way, occurrence of a seam in the stack formed by a plurality of atomic layer edges aligned in a direction transverse to the substrate may be substantially prevented. This improves a uniformity of physical properties of the stack, as well as a strength of the stack.

The inventor recognized that the features of this embodiment may be applied more broadly, optionally in combination with one or more of the other embodiments and/or features described herein. Accordingly, there is provided a method that comprises depositing a stack of atomic layers on the substrate, and further comprises realizing, e.g. linear, relative reciprocating motion between the precursor-gas supply and the substrate, which reciprocating motion comprises back-turning or reversing a direction of motion between the precursor-gas supply and the substrate at two subsequent back-turning positions or reversing positions, wherein an atomic layer deposited between the back-turning positions is offset with respect to a previously deposited atomic layer.

In an embodiment, an edge of the atomic layer deposited between the back-turning positions is at a different position from the substrate than a main part of the atomic layer deposited between the back-turning positions.

Preferably, the method is carried out by means of an apparatus according to the invention.

It is another objective of the invention to provide an improved stack of atomic layers.

Thereto the invention provides a stack of atomic layers deposited by means of a method according to the invention.

It is another objective of the invention to provide an apparatus for depositing an atomic layer that at least partly meets one or more of the problems of known apparatuses.

Thereto the invention provides an apparatus for depositing an atomic layer, preferably a stack of atomic layers, on a, e.g. flexible or rigid, substrate, the apparatus comprising a deposition head having a precursor-gas supply, preferably having a plurality of precursor-gas supplies, for supplying a precursor gas towards the substrate, the apparatus further comprising a mount for rotatably mounting the deposition head, preferably for mounting a drum that comprises the deposition head and/or for mounting a wheel on which the deposition head is mounted, and comprising a driver arranged for rotating the deposition head so as to move the precursor gas supply along the substrate; said deposition head being constructed for having the supplied precursor gas react near, e.g. on, the substrate so as to form an atomic layer while continuously moving the precursor-gas supply along a rotation trajectory. The apparatus further comprises a gas source for providing precursor gas to the precursor gas supply via a gas flow path; and a gas switching structure arranged and constructed for switching between supplying the precursor gas from the precursor-gas supply towards the substrate over a first part of the rotation trajectory; and interrupting supplying the precursor gas from said precursor-gas supply over a second part of the rotation trajectory.

Optionally, the apparatus comprises the drum and/or the wheel. Hence, optionally, the apparatus comprises a drum that comprises the deposition head, wherein the mount is arranged for rotatably mounting the drum that comprises the deposition head. Preferably, the apparatus is arranged for moving the substrate along an, at least partly rounded, circumference of the rotatable drum.

With such an apparatus, a stack of atomic layers can be deposited while continuously moving the precursor-gas supply and/or the substrate in one direction. Thus, moving the precursor-gas supply and/or the substrate reciprocatingly may be prevented when depositing the stack of atomic layers. In this way back-turning of the precursor head and/or the substrate, being inherent to reciprocating motion, can be prevented. As a result, a deposition rate of the atomic layers can be increased.

In an embodiment, the apparatus comprises a transporter arranged to transport the substrate along the precursor-gas supply subsequently to and/or simultaneously with supplying the precursor gas towards the substrate.

In an embodiment, the driver is adapted for realizing and/or controlling a translational velocity of the precursor-gas supply that is larger than and/or directed against a translational velocity of the substrate. This may further increase the deposition rate of the atomic layers. For example, an absolute value of the translational velocity of the precursor-gas supply is at least 5 times, at least 10 times, at least 20 times, at least 50 times, at least 100 times, at least 500 times, at least 1000 times, at least 5,000 times, and/or at least 10,000 times larger than an absolute value of the translational velocity of the substrate. Preferably, the driver comprises a driving controller arranged for controlling the translational velocity of the precursor-gas supply. Preferably, the transporter comprises a transportation controller arranged for controlling the translational velocity of the substrate. It may be clear that optionally the translational velocity of the precursor-gas supply may be directed in a direction of the translational velocity of the substrate.

In an embodiment, the precursor-gas supply is shaped in elongated form along, or inclined to, an axial direction of the deposition head that is directed along or inclined to the substrate and transverse to a moving direction of the precursor-gas supply and/or the substrate. Thus, in this embodiment, the precursor-gas supply may have its largest dimension in a direction transverse to the moving direction of the precursor-gas supply and/or the substrate. As a result, a substantial part of the substrate can be covered by the atomic layer. Thus, in this embodiment, the precursor-gas supply may have its smallest dimension in the moving direction of the precursor-gas supply and/or the substrate. In this way, an amount of precursor gas used can be substantially minimised. Preferably, the axial direction is directed along the substrate and perpendicular to the moving direction of the substrate.

In an embodiment, the deposition head has an output face that in use at least partly faces the substrate and is provided with the precursor-gas supply.

In an embodiment, the output face has a substantially rounded, typically a substantially cylindrical, shape defining a movement path of the substrate. Such an output face combines well with a rotating precursor head, because it enables maintaining, in use, a rather constant separation distance between the precursor head and the substrate.

In an embodiment, the apparatus is provided in assembly with the, e.g. flexible, substrate, wherein the substrate is provided, preferably at least once or less than once, around the deposition head, preferably around the output face of the deposition head. Preferably, in use, a first part of the substrate that is to be moved around the rotating deposition head at least once is located besides a second part of the substrate that has moved around the rotating substrate one time more than the first part of the substrate. Preferably, in use the first and second part of the substrate extend along the same line that is directed along the first and second part of the substrate and transverse to a moving direction of the substrate. In this way, the rotating precursor-gas supply may in use constantly face the substrate. As a result, leakage of the precursor gas can substantially be prevented, especially near a position where the substrate moves towards and reaches the deposition head and near a position where the substrate moves away from and leaves the deposition head. An amount of times that the substrate is provided around the deposition head may be an integer or may not be an integer.

In an embodiment, the apparatus is provided with a leaked-gas drain for draining the precursor gas that has leaked through a gap between the first and second part of the substrate.

In an embodiment, the transporter comprises a guide. The guide may be adapted to guide the substrate along a helical path around the deposition head. The substrate may be provided along the helical path at least once around the deposition head, preferably at least once around the drum comprising the wheel with the deposition head. In this way, it may be realized that the rotating precursor-gas supply may in use constantly face the substrate. The guide may e.g. comprise at least one, e.g. two, capstans. The guide, e.g. the at least one capstan of the guide, preferably has a length axis inclined relative to a rotational axis of the deposition head; in such a way as to guide the substrate along a helical path around the deposition head.

In an embodiment, in use the substrate substantially faces the whole precursor-gas supply. Thus, in use, the rotating precursor-gas supply may constantly face the substrate.

In an embodiment, the apparatus comprises a cover for confining the precursor gas, wherein the cover faces part of the deposition head and extends between parts of the substrate. By means of the cover, undesired flow of precursor gas to an outer environment of the apparatus may be substantially hindered or even prevented. The cover may extend along and/or in the gap between the first and second part of the substrate.

In an embodiment, the apparatus is arranged for maintaining a separation distance between the substrate and the rotating deposition head. In this way, mechanical contact between the substrate and the rotating deposition head may be prevented. As a result, the translational velocity of the precursor-gas supply can be larger than and/or directed against the translational velocity of the substrate. Preferably, the separation distance is substantially constant around at least a part, and preferably all, of the circumference of the deposition head.

In an embodiment, the transporter comprises a carrier for attaching the substrate thereto, the transporter being arranged for moving the carrier along the deposition head. By means of the carrier, a separation distance between the substrate and the rotating deposition head may be maintained. As a result, mechanical contact between the substrate and the rotating deposition head may be prevented. Preferably, the carrier comprises a mesh or grid.

In an embodiment, the guide may be arranged for moving the carrier there around along a transportation face of the guide that is conformal with the output face. By means of the conformal transportation face, the separation distance can be kept substantially constant over at least part of the output face.

In an embodiment, the apparatus comprises a selectively controllable laser for reacting the precursor gas near, e.g. on, the substrate so as to form the atomic layer by selectively controlling the laser. By means of such a laser, the deposited precursor material may be selectively treated for reacting the deposited precursor material. Such selective controlling may comprises selectively controlling an intensity of the laser, e.g. turning the laser on and off. Alternatively, selectively controlling the laser may comprise selectively diverting a beam of the laser away from the deposited precursor material. In this way, a patterned atomic layer may be deposited. Such a patterned atomic layer may be useful for manufacturing openings in the atomic layer and/or for defining spatial variations in wettability on the substrate. The laser may be arranged for generating a plurality of beams. In use, the plurality of beams may be individually directed, e.g. in different directions, towards distinct precursor-gas supplies.

In an embodiment, the apparatus is provided with a bearing-gas supply for supplying a bearing gas between the deposition head and the substrate for forming a gas-bearing layer that separates the substrate and the deposition head. In this way, a rather narrow separation distance between the rotating deposition head and the substrate may be maintained. The separation distance may e.g. be at most 200 micrometers, at most 100 micrometers, at most 15 micrometers, or at most 10 micrometers, e.g. around 5 micrometers. At the same time, the separation distance may be at least 3 micrometers, at least 5 micrometers, or at least 10 micrometers. Such small separation distances reduce an amount of excess precursor gas that is provided towards the substrate. This may be worthwhile as the precursor gas may usually add to production costs.

In an embodiment, the deposition head comprises the bearing-gas supply, being arranged for supplying the bearing gas towards the substrate for providing the gas-bearing layer.

In an embodiment, the deposition head is provided with a cavity that, in use, faces the substrate and wherein the precursor-gas supply is preferably positioned in the cavity for supplying the precursor gas in the cavity towards the substrate, and wherein the deposition head is provided with a precursor-gas drain that is preferably positioned in the cavity for draining the precursor gas from the cavity for substantially preventing precursor gas to escape from the cavity, wherein the deposition head is further provided with a bearing-gas supply spaced apart from the cavity for supplying the bearing gas at a distance from the cavity. By having the cavity facing the substrate, it is understood that the substrate is substantially forming a closure for the cavity, so that a closed environment is formed for supplying the precursor gas. In addition, the substrate may be provided such that various adjacent parts of the substrate or even adjacent substrates may be forming such closure. A cavity thus formed makes it possible to apply process conditions in the cavity that are different from process conditions in the gas-bearing layer. In the gas-bearing layer, i.e. near or adjacent to the bearing-gas supply, the separation distance may be at least 3 micrometers, at least 5 micrometers, at least 10 micrometers, and/or at most 15 micrometers. In the cavity the separation distance may be at most 500 micrometers, at most 200 micrometers, at most 100 micrometers, at most 50 micrometers, and/or at least 25 micrometers. The inventor recognised that the features of this embodiment may be applied more widely, optionally in combination with one or more of the other embodiments and/or features described herein. Accordingly, there is provided an apparatus for depositing an atomic layer on a substrate, the apparatus comprising a deposition head having a precursor-gas supply, preferably a plurality of precursor-gas supplies, for supplying a precursor gas towards the substrate, the apparatus further comprising a driver arranged for realizing relative motion between the precursor gas supply and the substrate along the substrate; said deposition head being constructed for having the supplied precursor gas react near, e.g. on, the substrate so as to form an atomic layer.

In an embodiment, the deposition head is provided with a cavity that, in use, faces the substrate and wherein the precursor-gas supply is positioned in the cavity for supplying the precursor gas in the cavity towards the substrate, and wherein the deposition head is provided with a precursor-gas drain that is positioned in the cavity for draining the precursor gas from the cavity for substantially preventing precursor gas to escape from the cavity, wherein the deposition head is further provided with a bearing-gas supply spaced apart from the cavity for supplying the bearing gas at a distance from the cavity. Preferably, this apparatus is arranged and/or used for manufacture of a photovoltaic panel or a part thereof. Preferably, the atomic layer is part of the photovoltaic panel or the part thereof. Realizing relative motion between the precursor gas supply and the substrate along the substrate may comprise simultaneously holding the precursor-gas supply in rest and transporting the substrate may comprise simultaneously moving the precursor-gas supply and holding the substrate in rest, and/or may comprise simultaneously moving the precursor-gas supply and transporting the substrate.

In an embodiment, the deposition head comprises the precursor-gas drain for draining there through the precursor gas.

In an embodiment, the output face is provided with the precursor-gas drain, the cavity and/or the bearing-gas supply.

Other advantageous embodiments of the apparatus and method are described in the dependent claims.

The invention will now be described, in a non-limiting way, with reference to the accompanying drawings, in which:

FIG. 1A shows an example of a stack of layers with offset;

FIG. 1B shows an example of isolated stacks of layers;

FIG. 1E(B) shows a side view of FIG. 1E(A).

FIG. 1E(C) shows a zoom in of FIG. 1E(B).

Figure 2A:
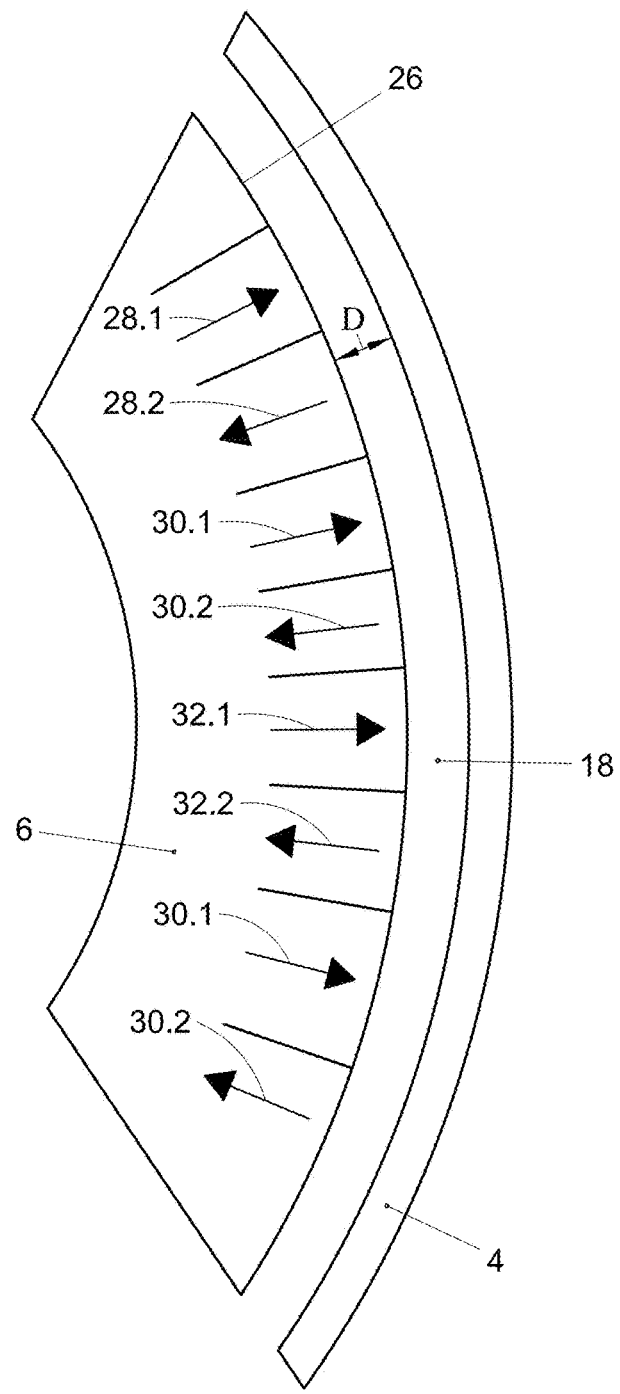
Figure 2B:
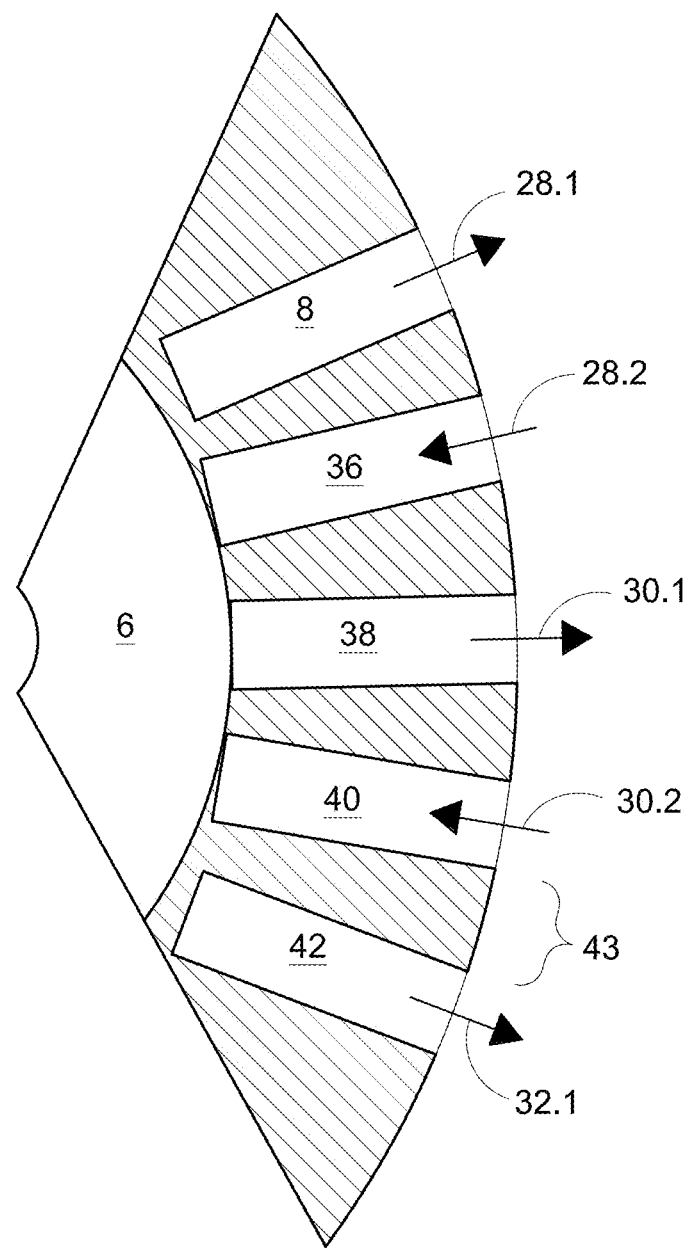
Figure 3A:
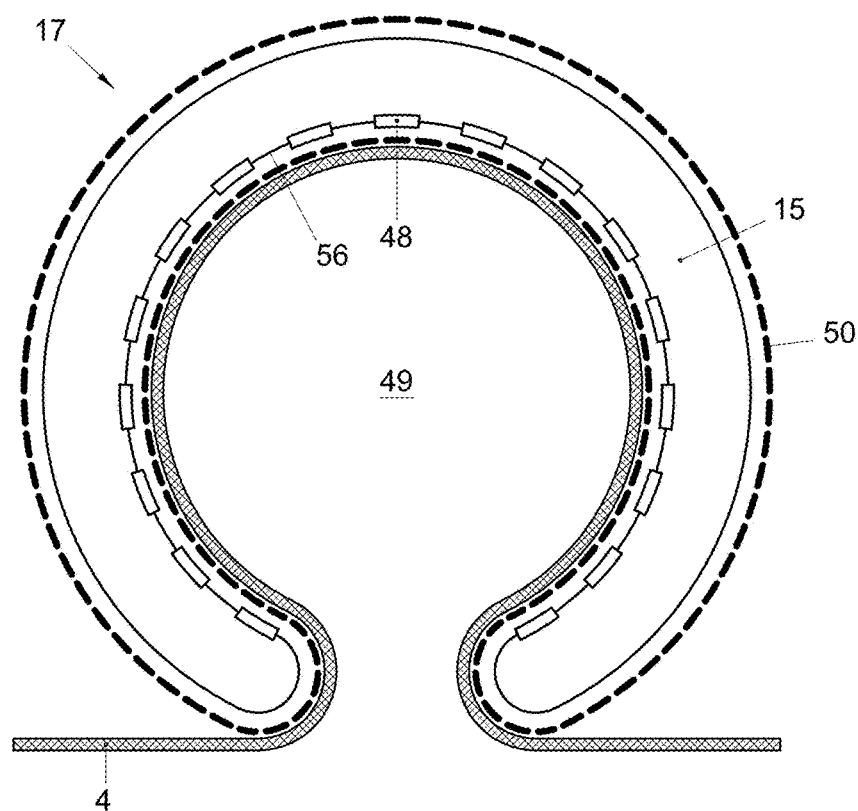
Figure 3B:
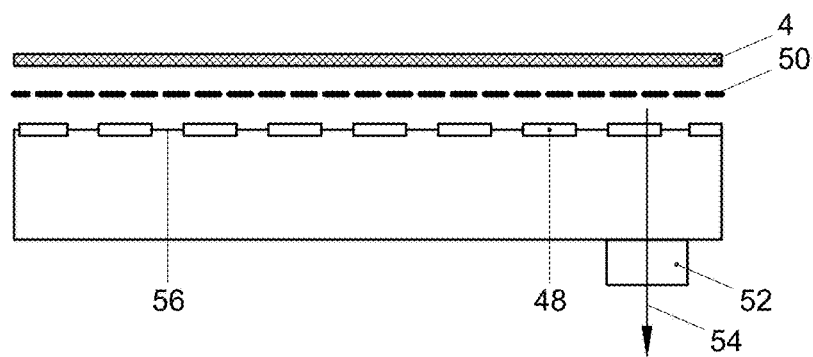
Figure 4:
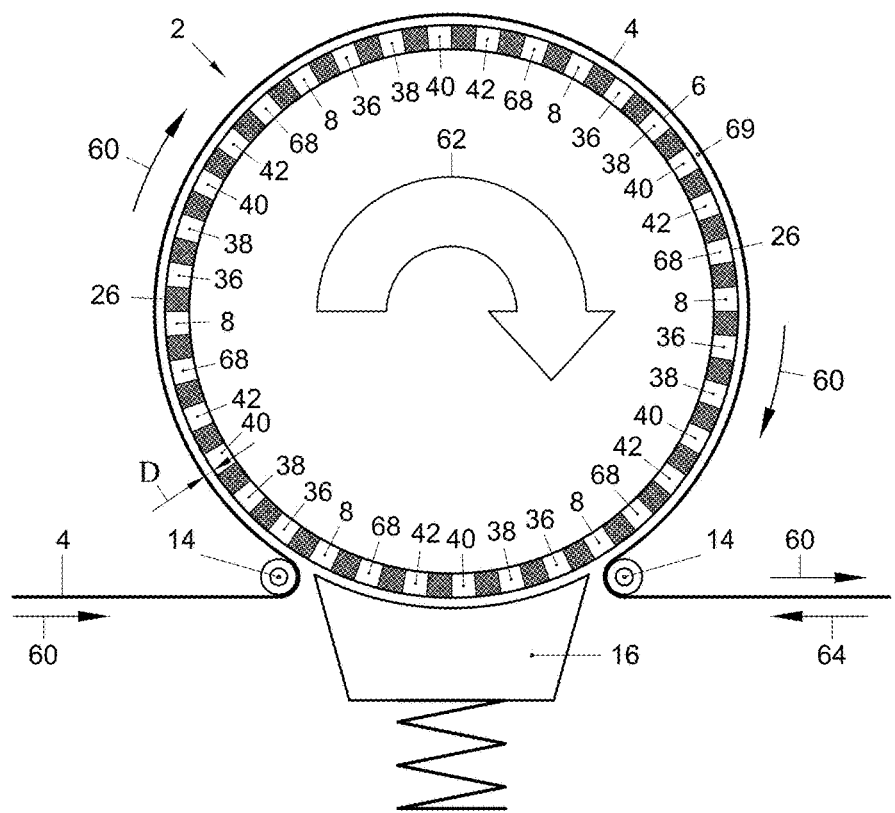
Figure 4A:
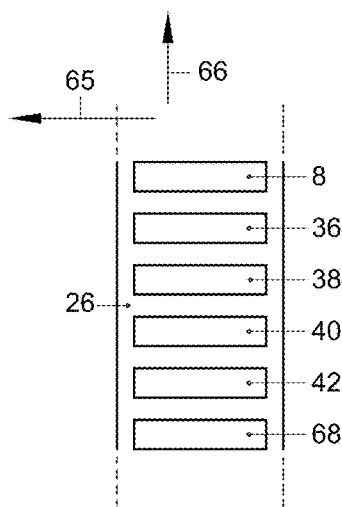
Figure 5:
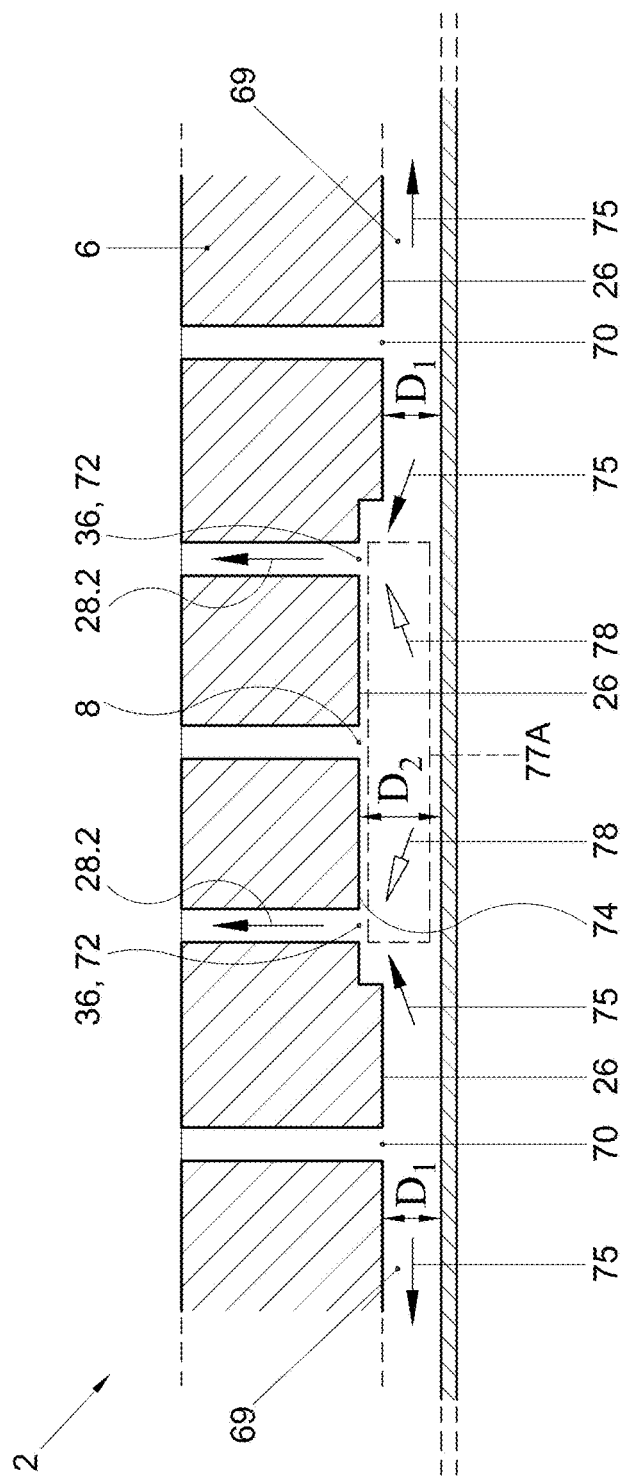
Figure 7:
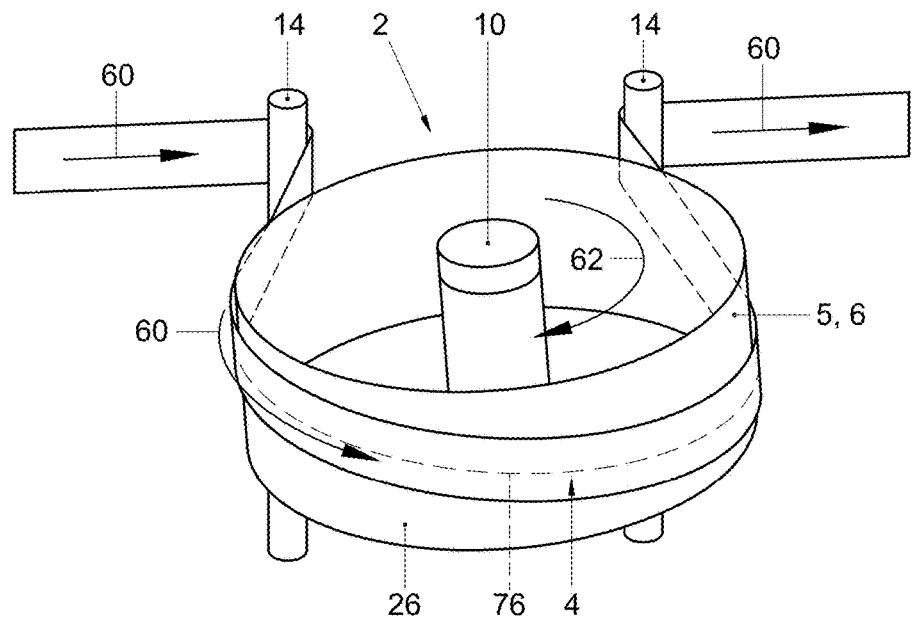
Figure 8:
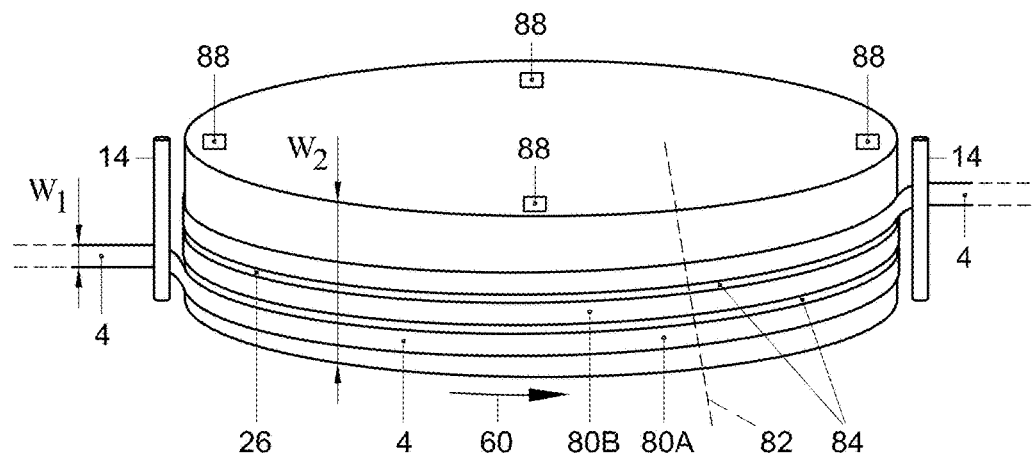
Figure 9:
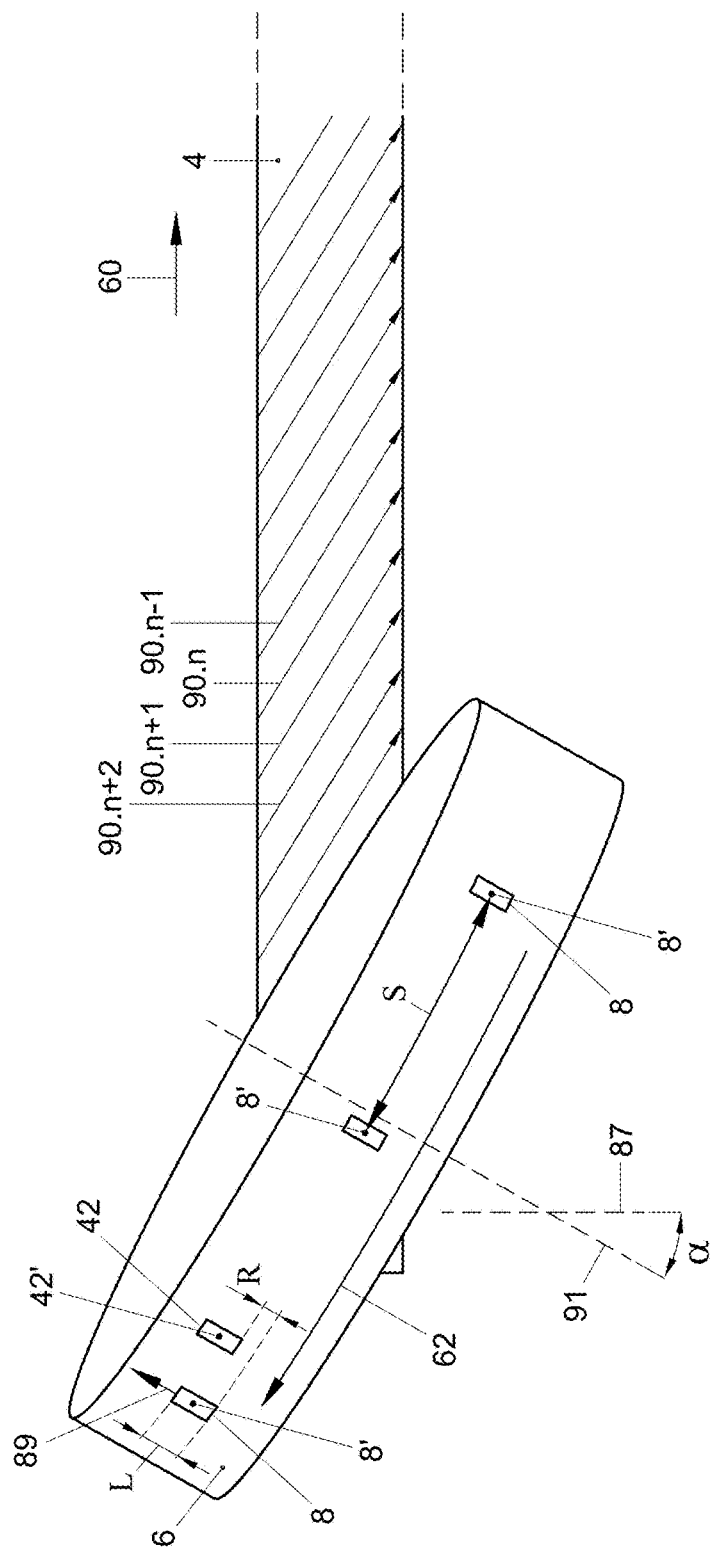
Figure 9A:
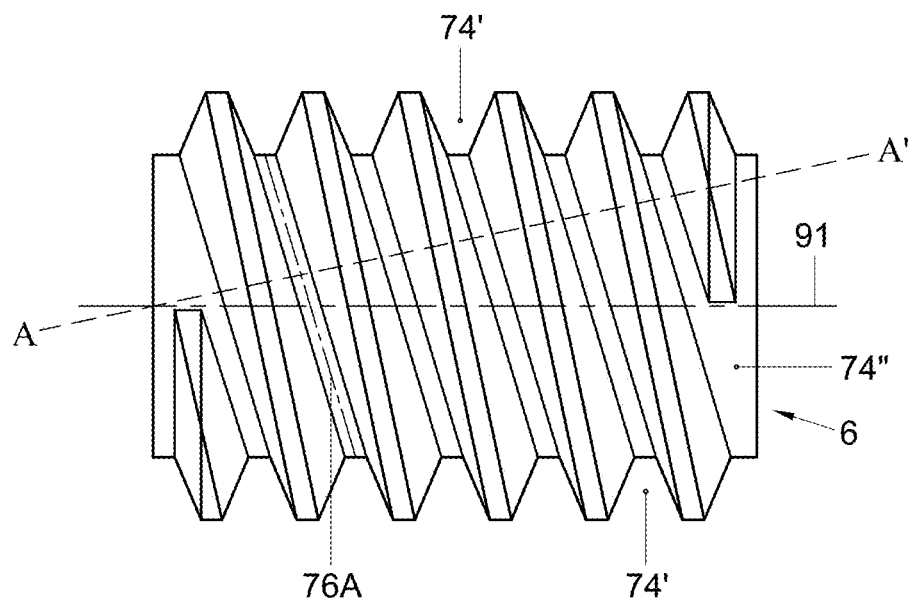
Figure 9B:
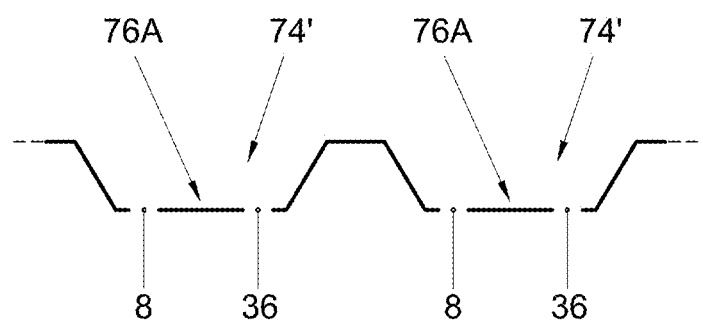

FIG. 2A schematically shows a basic functional part of a deposition head of the apparatus 2 in the first embodiment, and a substrate;

FIG. 2B partly shows a possible structure of a part of the deposition head shown in FIG. 2A;

FIGS. 3A and 3B show a part of a transporter;

FIG. 4 shows an apparatus 2 for depositing an atomic layer on a substrate 4, in a second embodiment according to the invention;

FIG. 4A shows an example of an output face provided with elongatedly shaped supplies;

FIGS. 5 and 6 show variations of the apparatus 2 in the second embodiment, wherein the deposition head is provided with a cavity that, in use, faces a substrate;

FIG. 6A shows a variation of the deposition head in the second embodiment;

FIG. 7 shows an apparatus in a third embodiment according to the invention, in assembly with a substrate;

FIG. 8 shows an apparatus in a fourth embodiment according to the invention, in assembly with a substrate;

FIG. 9 schematically shows a moving direction of a substrate and a moving direction of a deposition head;

FIG. 9A shows an embodiment of a deposition head of an apparatus according to the invention, wherein a precursor-gas supply extends along a helical path;

FIG. 9B shows a part of a cross-section A-A' as indicated in FIG. 9A;

FIG. 10 shows a stack of layers and shows subsequent back-turning positions;

FIG. 11A shows an example wherein an axis of rotation of a deposition head is be aligned with a moving direction of a substrate; and FIG. 11B shows the deposition head in a viewing direction along the axis of rotation of the deposition head.

Figure 12:
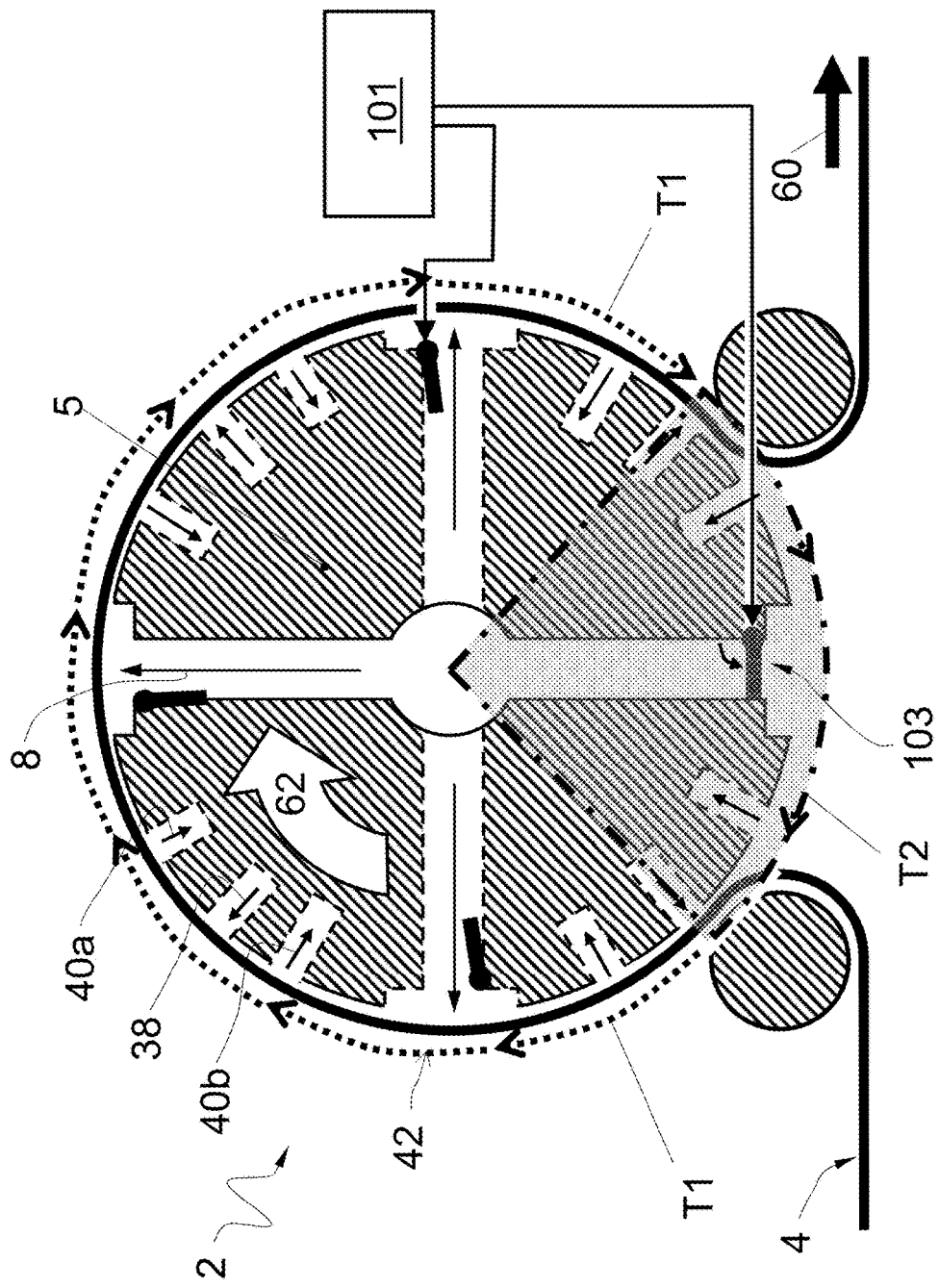

FIG. 12 shows a schematic cross section of an embodiment comprising a gas switching structure.

Figure 13:
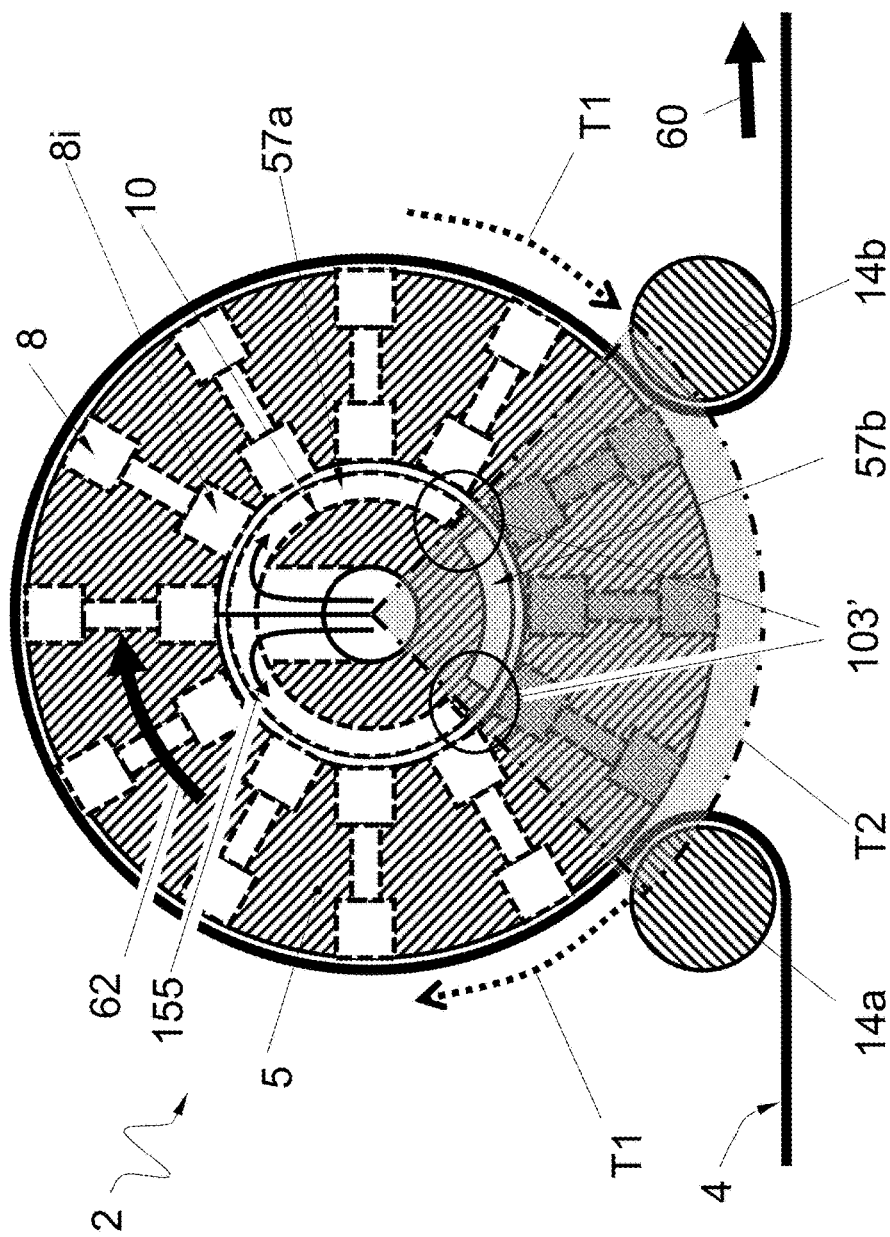

FIG. 13 shows a schematic cross section of an embodiment comprising another gas switching structure.

Figure 14:
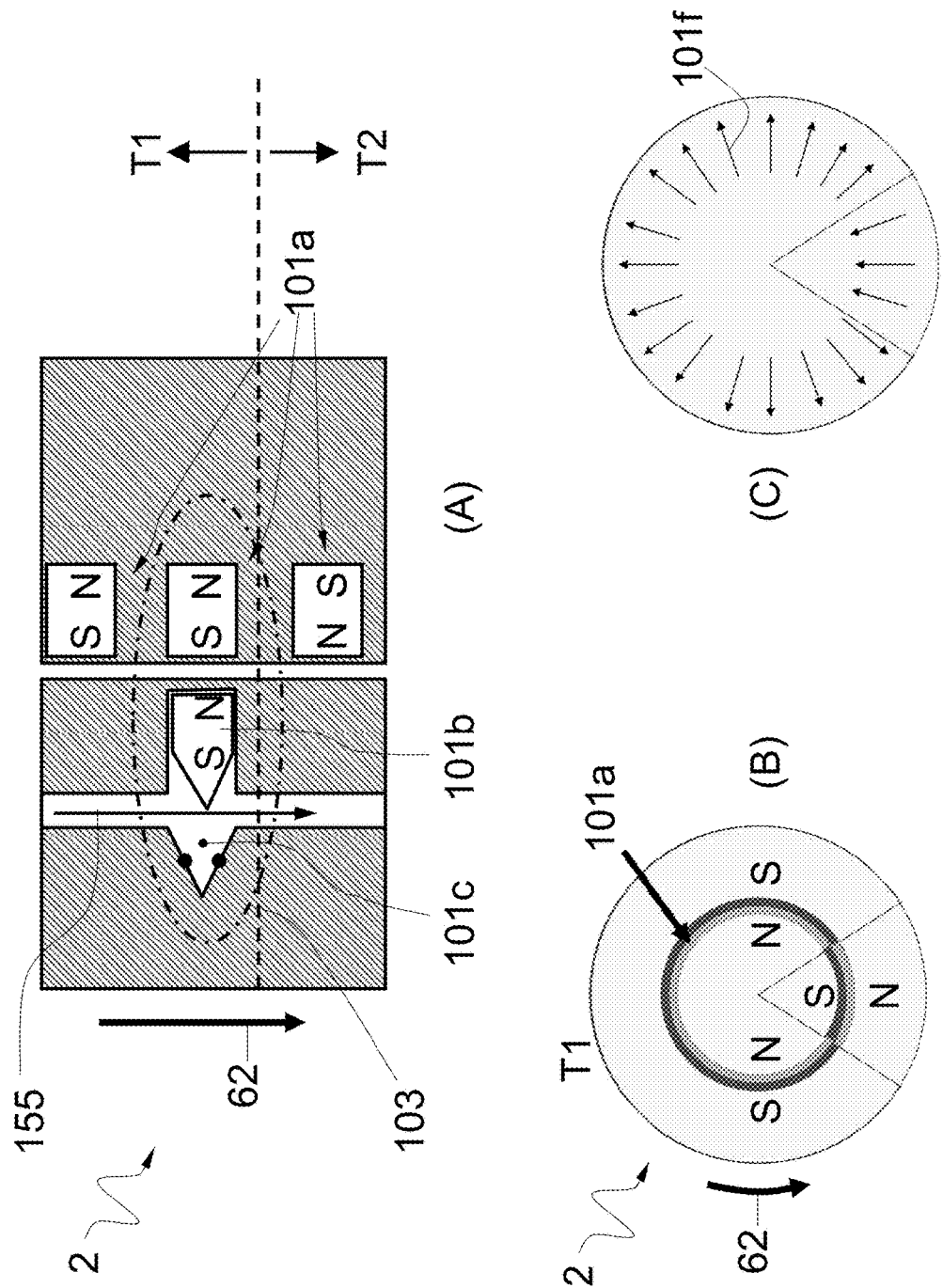

FIG. 14 shows yet another gas switching structure.

Figure 15:
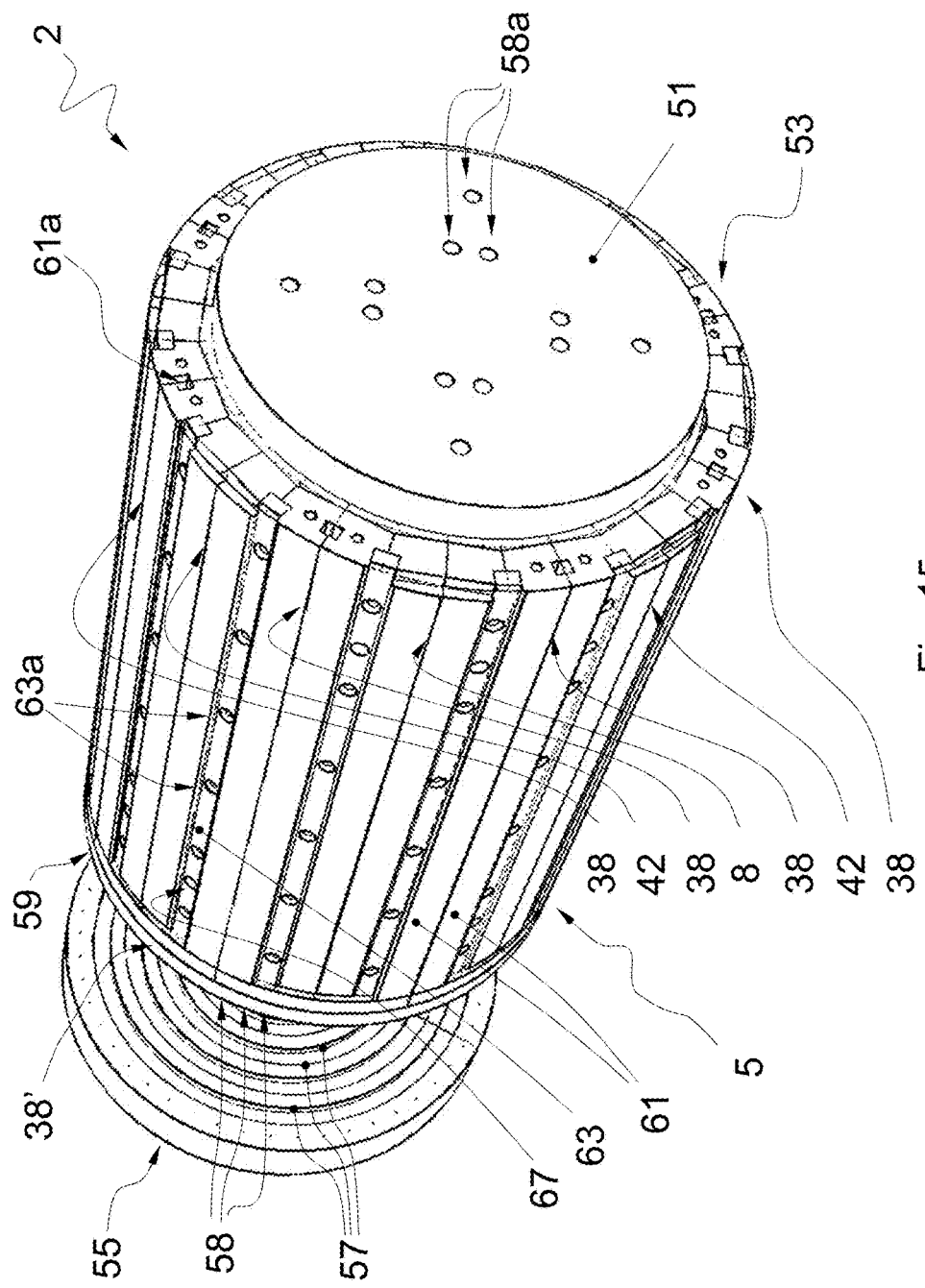

FIG. 15 shows an embodiment with yet another gas switching structure.

Figure 16:
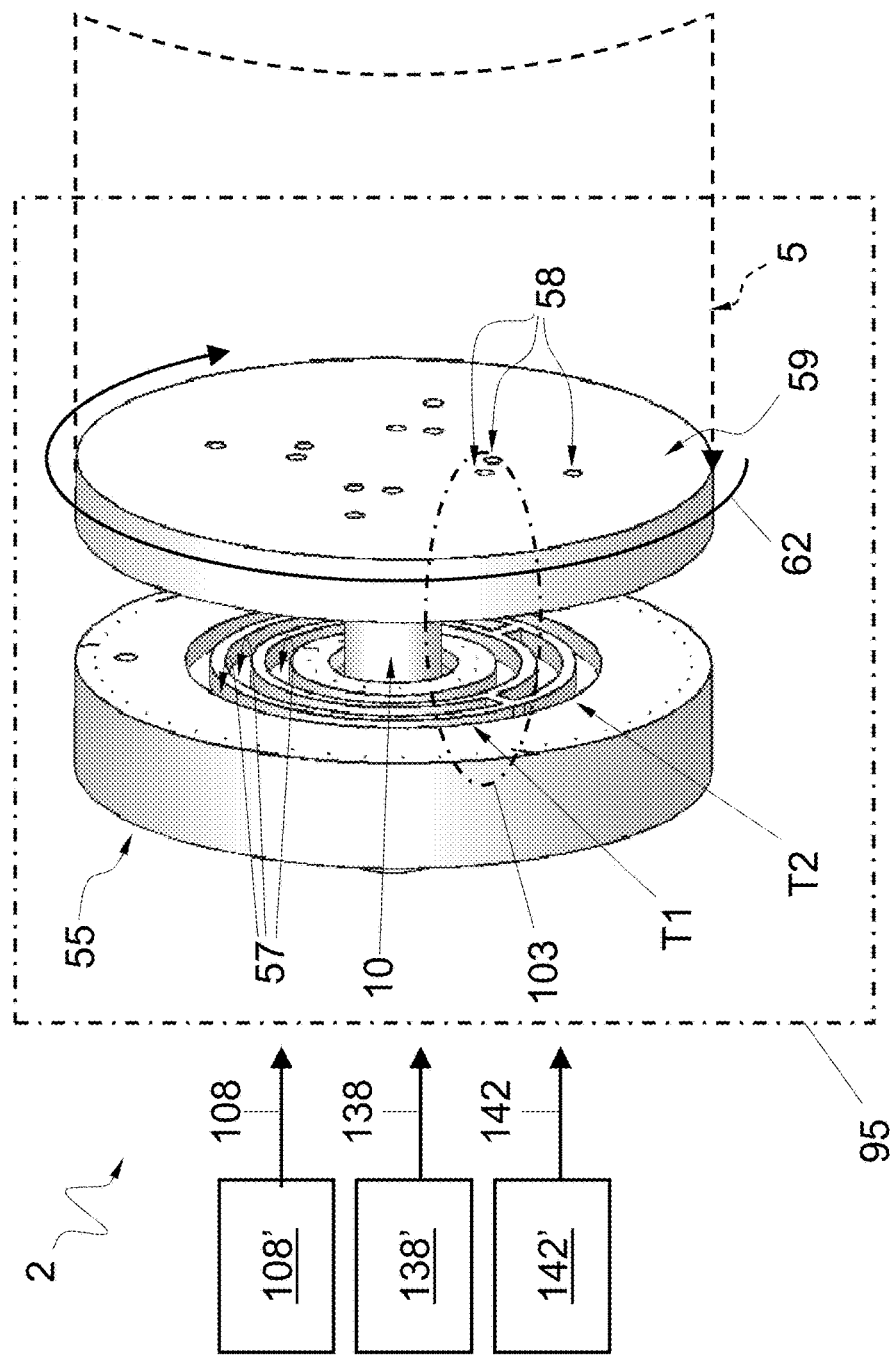

FIG. 16 shows a detail of the gas switching structure of FIG. 15.

Figure 17:
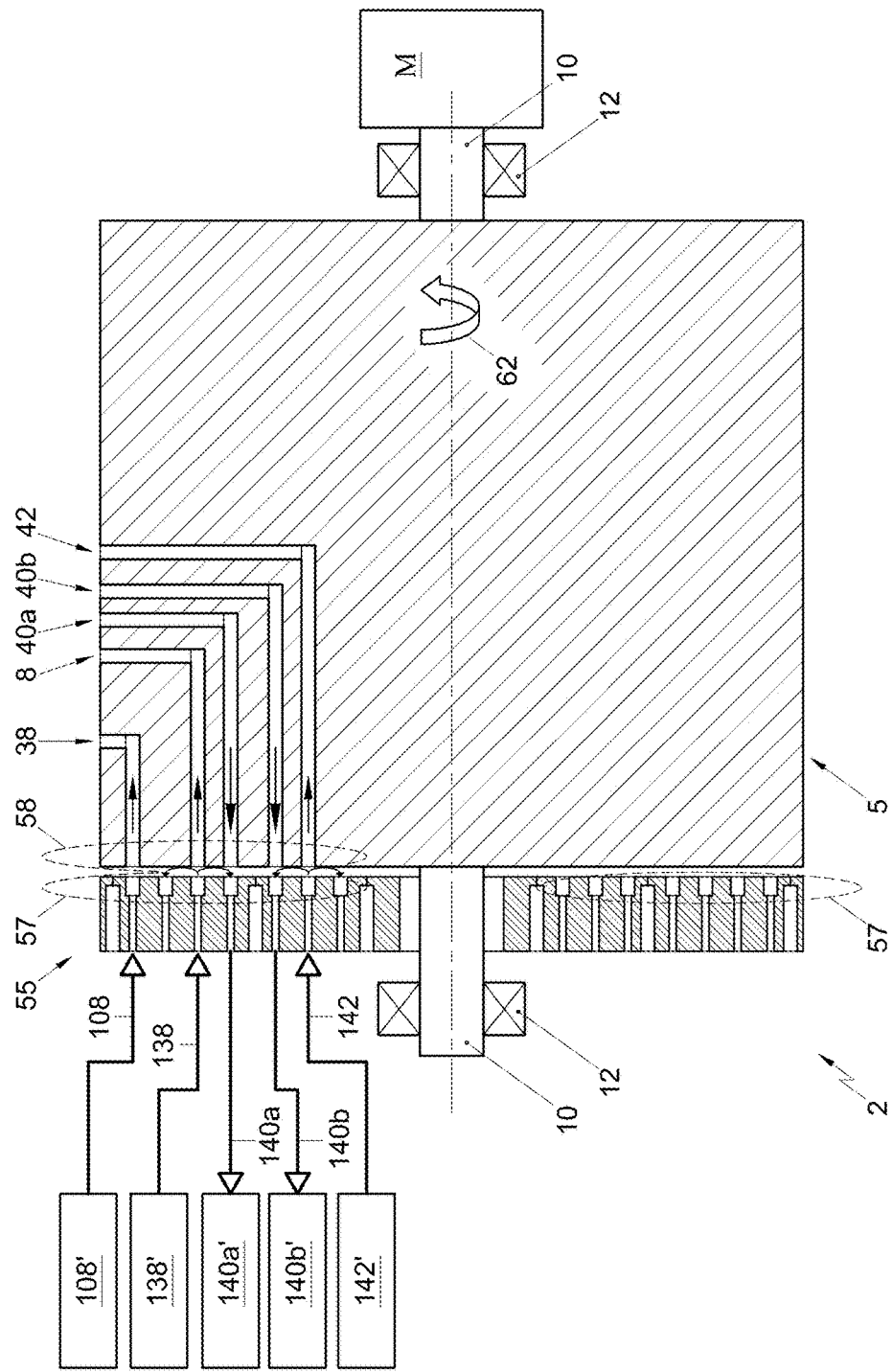

FIG. 17 shows an embodiment of the gas switching structure of FIG. 15.

Figure 18:
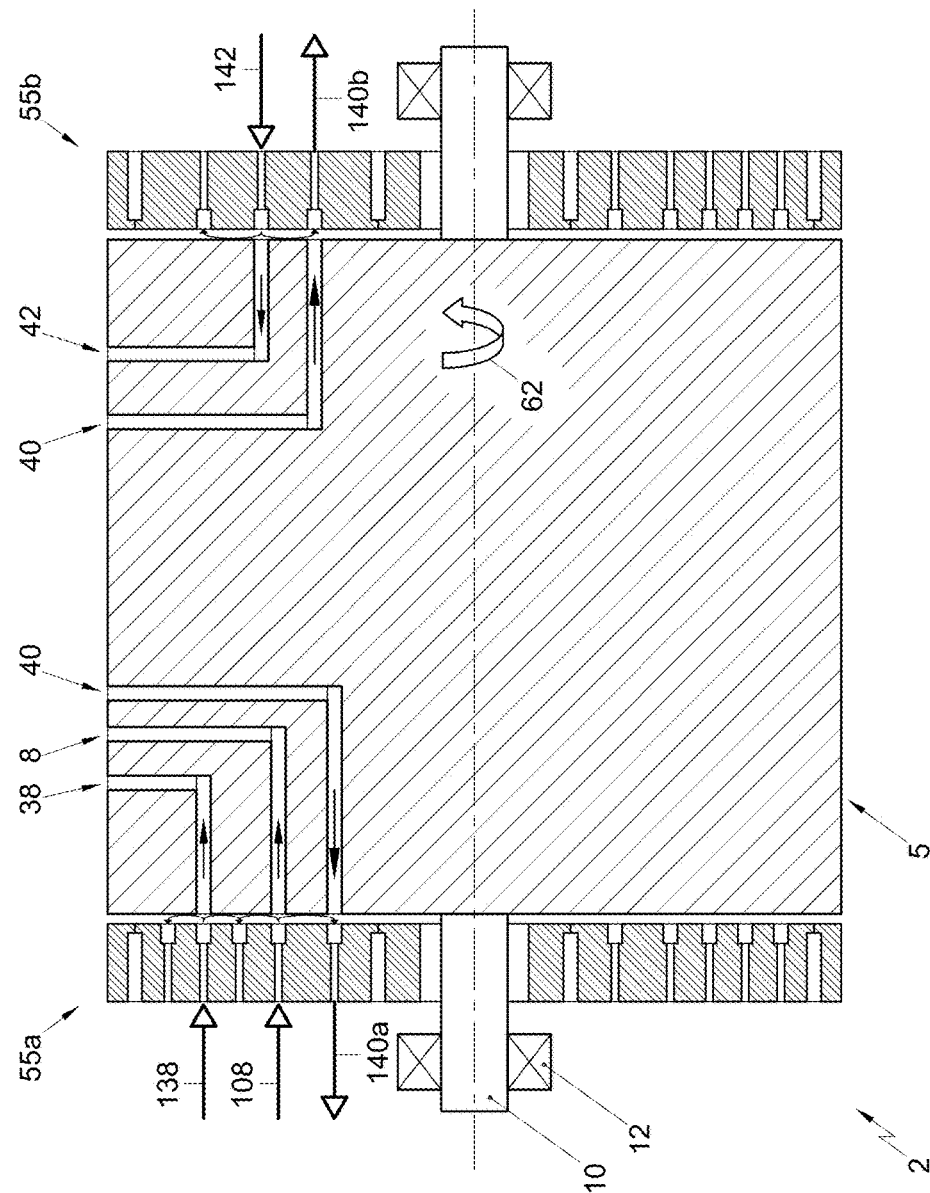

FIG. 18 shows another embodiment of the gas switching structure of FIG. 15.

Unless stated otherwise, like reference numerals refer to like elements throughout the drawings.

Atomic layer deposition is known as a method for depositing a monolayer of target material in at least two process steps, i.e. half-cycles. A first one of these self-limiting process steps comprises application of a precursor gas on the substrate surface. A second one of these self-limiting process steps comprises reaction of the precursor material in order to form the monolayer of target material on a substrate. The precursor gas can for example contain metal halide vapours, such as hafnium tetra chloride ($HfCl_4$), but can alternatively also contain another type of precursor material such as metalorganic vapours, for example tetrakis-(ethyl-methyl-amino)hafnium or trimethylaluminium ($Al(CH_3)_3$). The precursor gas can be injected together with a carrier gas, such as nitrogen gas, argon gas or hydrogen gas or mixtures thereof. A concentration of the precursor gas in the carrier gas may typically be in a range from 0.01 to 1 volume %, but can also be outside that range.

Reaction of the precursor gas may be carried out in a number of ways. First, a monolayer of deposited precursor material can be exposed to a plasma. Such plasma-enhanced atomic layer deposition is especially suitable for deposition of medium-k aluminum oxide ($Al_2O_3$) layers of high quality, for example for manufacturing semiconductor products such as chips and solar cells. Thus, the invention may e.g. be used for manufacturing solar cells, in particular for manufacturing flexible solar cells, by depositing one or more layers of a solar cell. Second, a reactant gas can be supplied towards the deposited monolayer of deposited precursor material. The reactant gas contains for example an oxidizing agent such as oxygen ($O_2$), ozone ($O_3$), and/or water ($H_2O$). Nitriding agents such as $N_2$, $NH_3$, etc. can be used alternatively to form nitrides such as silicon nitride ($Si_3N_4$). It is noted that the reactant gas may also be considered as a (second) precursor gas, e.g. two or more precursor gasses may react with each other to form an atomic layer as a reaction product.

In an example of a process of atomic layer deposition, various stages can be identified. In a first stage, the substrate surface is exposed to the precursor gas, for example hafnium tetrachloride. Deposition of the precursor gas is automatically terminated upon saturation of the substrate surface with a monolayer of by a single layer of chemisorbed precursor gas molecules. This self-limitation is a characteristic feature of the method of atomic layer deposition. In a second stage, excess precursor gas is purged using a purge gas and/or a vacuum. In this way, excess precursor molecules can be removed. The purge gas is preferably inert with respect to the precursor gas. In a third stage, the precursor molecules are exposed to a plasma or to a reactant gas, for example an oxidant, such as water vapor ($H_2O$). By reaction of functional ligands of the reactant with the remaining functional ligands of the chemisorbed precursor molecules, the atomic layer can be formed, for example hafnium oxide ($HfO_2$). In a fourth stage, excess reactant molecules are removed by purging. In addition, additional reactant stimulation systems may be used, for example, thermal, photonic or plasma excitation.

Figure 1:
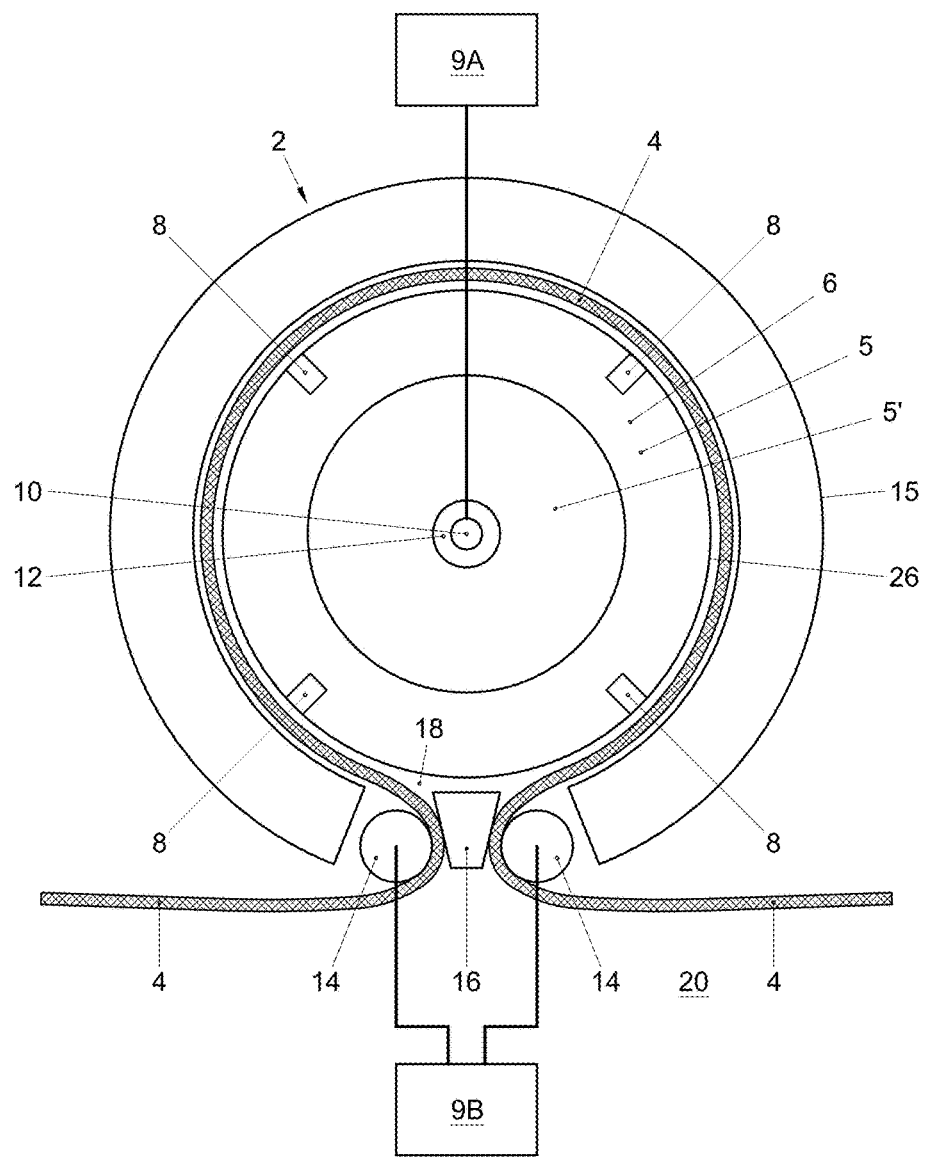
FIG. 1 shows an apparatus for depositing an atomic layer on a substrate, in a first embodiment according to the invention.

FIG. 1 shows an apparatus 2 for depositing an atomic layer on a, e.g. flexible, substrate 4, in a first embodiment according to the invention. The apparatus 2 comprises a deposition head 6 having precursor-gas supply 8. The deposition head 6 may be comprised by a rotatable drum 5. The drum 5 may comprise a rotatable wheel 5' with the deposition head 6 attached thereto. By means of the precursor-gas supply, precursor gas can be supplied towards the substrate 4. The apparatus 2 further comprises a mount arranged for rotating the precursor-gas supply along the substrate 4. The mount may comprise a bearing 12 that is arranged to receive an axle 10. The axle may be rigidly connected to the precursor-gas supply. Through the bearing 12, the axle 10 and the deposition head 6 can rotate with respect to the mount. An axis of rotation around which the deposition head can rotate may coincide with a center of the axle 10, e.g. with a length axis of the axle 10. The mount may thus be adapted for realizing a translational velocity of the precursor-gas supply along the substrate.

Alternatively, other mounting embodiments may be applied that do not comprise axle 10 or bearing 12. In particular, the drum may be mounted via output face 26. Hence, it may, more in general, be clear that the axis of rotation of the deposition head may coincide with an axis of rotation of the drum.

The apparatus 2 may further comprise a driver that is connected to the axle 10 for driving the axle 10 and the deposition head. The driver may be provided with a driving controller 9A. By means of the driving controller, the driver may be adapted for realizing and controlling a translational velocity of the precursor-gas supply along the substrate. Such drivers and driver controllers are known as such so that a further description is deemed superfluous.

The axle 10 may comprise an elongated cavity aligned along its axis. In use, the precursor gas may be transported through the cavity 11A of the axle. Thereto a gas supply structure may extend into the cavity of the axle. From the cavity 11A of the axle 10, the precursor gas may be transported to the precursor-gas supply.

Ways to obtain a gas-tight connection between the gas supply structure and the axle that allows for rotational motion between the axle and the gas supply structure are discussed in more detail in the following e.g. with reference to FIGS. 1C-1F and FIGS. 15-18.

A few general requirements for a gas supply system onto a rotating spatial reel-to-reel (R2R) atomic layer deposition (ALD) system may be that if the gas supply originates from a stationary feed assembly, for a moving, i.e. rotating, spatial ALD system, a gas feed-through design is needed to feeding the gas from the stationary feed assembly to the rotating ALD system. Such feed-through should not generate particles that would inevitably contaminate the ALD process, resulting in, e.g., the creation of pinholes in deposited barrier layers. Thus preferably the two vapor supplies (e.g. a precursor gas TMA and a reactant gas $H_2O$) are completely separated throughout the entire gas circuit systems of the R2R equipment.

In the following, three main designs are described for two or more independent, separated gas supply configurations:

In a first design there is provided a coaxial drum set with internal gas bearing/concentric tubes with leaky seals, and switchable flow interruption valves. One is a gas supply design where the supply line of one precursor gas is closed when its gas inlet opening is moving into the segment where the drum is not covered by the foil. This can be accomplished by inserting a valve system that can be e.g. magnetically, electrostatically and/or gravitationally actuated or a combination thereof, described later in more detail with reference to FIG. 14. Several precursors and process gases may run through different inner tubes of a (concentric) tube assembly. Separation of precursors and other process gases can be done by pressure differences. For example, inert gas (used for purging) is allowed to flow in the precursor tube, but not the other way around. (Concentric) tubes with leaky seals allow for gas and precursor supply from one or both sides of the drum. E.g. FIG. 1E illustrates this concept.

In a second design there is provided an integrated multiple flow selector/restrictor system, built in a coaxial drum set with gas-bearings and gas feed-through from a so-called shape-controlled axis. Here, the gas feed-through can be equipped with a gas bearing. The (inert) gas bearing may separate the rotating tube from the stationary tube; the gas bearing may be leaky. The concept of concentric tubes with leaky seals can be augmented by gas bearings to decrease leakage. E.g. FIG. 1F illustrates this concept. The supply design may be based on integrated flow restrictor supply line circuits, one circuit for each reactant and gas bearing of the web. The off-and-on switching of gases is based on supply lines that are composed by grooves, engraved in the circumference of a rotating drum and inserts around the rotating drum. The inserts form two halves of a concave cross section to compose a divider chamber when mounted face-to-face, and on the drum.

In a third design there is provided an integrated multiple flow selector/restrictor system, built in a drum with gas feed-through from one or two disk(s) sealingly held against the axial side(s) of the drum. This supply design is based on integrated flow restrictor supply line circuits, one circuit for each precursor and/or reactant gas and one for the gas bearing of the web. The off-and-on switching of gases is based on supply lines that communicate upon rotation of the outer disk(s) with respect to the inner drum. The rotating ALD drum can have a gas bearing. The gases are supplied to the stationary part of the gas bearing. The gases are transferred from the stationary part to the rotating part through internal channels in the stationary and rotating part. Multiple channels with different gases/precursors can be used in parallel using gas separation. FIG. 17 or 18 illustrate an example.

Figure 1C:
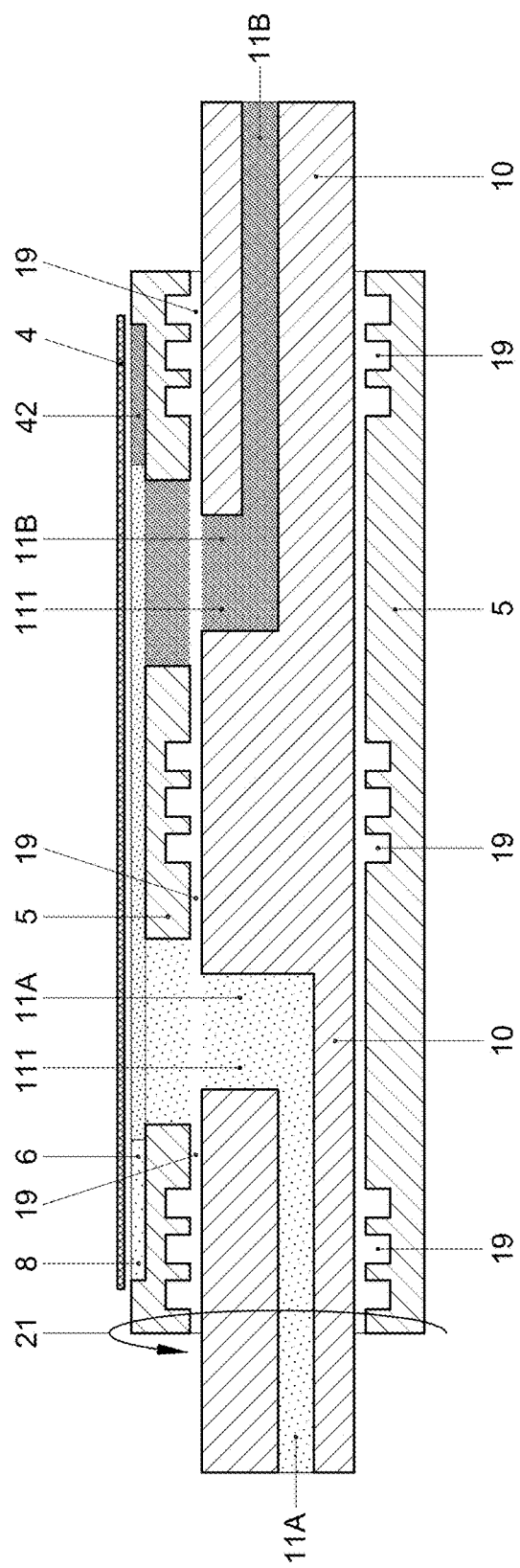
FIG. 1C shows a schematic cross section wherein a deposition head, a precursor-gas supply and optionally a drum are movable with respect to an axle.

FIG. 1C shows an embodiment wherein the deposition head, the precursor-gas supply, and optionally the drum 5 are movable with respect to the axle 10. A mount of the apparatus may comprise the axle 10. FIG. 1C shows a schematic cross-section of the axle 10 provided with a first, e.g. elongated, axle cavity 11A for supplying the precursor gas through the axle towards the precursor-gas supply.

In the cross-section of FIG. 1C, the deposition head 6 and the substrate 4 are visible at only one side of the cross-section. However, in an embodiment, other cross-sections may be possible wherein the deposition head 6 and/or the substrate 4 is visible at two sides of the cross-section. The axle 10 may be provided with a second, e.g. elongated, axle cavity 11B for supplying an additional gas through the axle towards the deposition head. For example, the second axle cavity 11B may be arranged for supplying a reactant gas through the axle towards a reactant-gas supply 42. Alternatively, the second axle cavity 11B may be arranged for supplying a purge gas through the axle towards a purge-gas supply 38.

The axle cavities 11A, 11B may be comprised by an axle feed-through 111 for supplying at least the precursor gas through the axle towards the precursor supply. Advantageously, an axle gas bearing 19 may be provided in between the axle on one hand and the drum and/or the deposition head on the other hand. A bearing pressure in the axle gas bearing may be controlled to substantially prevent leakage out of the axle cavities 11A, 11B. Such an axle gas bearing may decrease the amount of particles that is generated during rotation, compared to e.g. sliding mechanical contact between the axle and the drum or between the gas supply structure and the axle. The axle gas bearing 19 may provide for a gas connection between the axle on one hand and the rotating drum and/or the deposition head on the other hand that substantially prevents leakage of precursor gas through the axle gas bearing.

Thus, the mount may be provided with a mount gas bearing, e.g. the axle gas bearing, that forms part of an enclosure of a gas connection between a gas supply and/or drain structure (not drawn but e.g. conventional) on one hand, and the deposition head on the other hand. A pressure in said mount gas bearing may be arranged for preventing leakage of precursor gas through the mount gas bearing out of the gas connection. At the same, the mount gas bearing may be arranged for allowing rotation of the deposition head with respect to the gas supply and/or drain. Rotation of the deposition head 6 and the precursor-gas supply 8, and optionally of the drum 5, is indicated with arrow 21. In such an embodiment, the axle may in use be stationary. Then, the axle may be rigidly connected to the gas supply structure.

Additionally, or alternatively, the apparatus may in an embodiment be provided with a cartridge that contains the precursor gas. Then, the gas-tight connection may be omitted. Transport of other gasses can be analogous to the transport of the precursor gas towards the precursor gas supply as described hereinbefore.

Thus, more in general, the mount may comprise an axle for, optionally rotatably or rigidly, mounting the deposition head and/or the drum thereon. The axle may be provided with an axle feed-through, e.g. an axle cavity, for supplying at least the precursor gas through the axle towards the precursor-gas supply. A method according to the invention may comprise: providing the deposition head and/or the drum mounted on an axle; providing at least the precursor gas through the axle towards the precursor-gas supply. The mount may be provided with a mount gas bearing that forms part of an enclosure of a gas connection between a gas supply and/or drain structure on one hand, and the deposition head on the other hand. A pressure in said mount gas bearing may be arranged for preventing leakage of gas through the mount gas bearing out of the gas connection.

The mount gas bearing may be arranged for allowing rotation of the deposition head with respect to the gas supply and/or drain. The apparatus 2 may comprise a transporter system to transport the substrate along the precursor-gas supply. The transporter may comprise a closure element or guide 15 for transporting the substrate 4 along the precursor-gas supply 8 and deposition head 6, as further illustrated in FIGS. 3A and 3B. Furthermore, such a transporter, e.g. such a guide, may comprise capstans 14. The capstans may be stationary. However, preferably, the capstans are rolling capstans, i.e. capstans that can be rotated around an axis of symmetry or a length axis of the capstans 14. The transporter may further comprise a transportation controller 9B for controlling a velocity with which the substrate 4 passes the rolling capstans 14. Such a transportation controller 9B is known as such so that a further description is deemed superfluous. The transportation controller may for example control a rotation velocity of one or both of the rolling capstans 14. Thereto the transportation controller 9B may be connected to the rolling capstans 14.

Thus, by means of the transportation controller 9B and the driving controller 9A, respectively, a translational velocity of the substrate and the translational velocity of the precursor-gas supply can be controlled. Preferably, the translational velocity of the precursor-gas supply is larger than the translational velocity of the substrate. In this way, relative movement between the precursor-gas supply and the substrate with a relatively high velocity can be obtained.

The translational velocity of the substrate may e.g. be approximately 0.1 m/s. For all embodiments presented herein, the precursor head may rotate with a frequency of at least 0.1 or 1 revolution per second. The precursor head may rotate with a frequency of e.g. approximately 30 revolutions per second. The translational velocity of the precursor-gas supply may e.g. be approximately 1 m/s. Furthermore, as the precursor-gas supply in use rotates, the precursor-gas supply can move in a continuous fashion in the same direction along one and the same part of the substrate 4 a plurality of times. In this way, a plurality of atomic layers can be deposited on the substrate. In this way one relatively thick composite layer can be obtained that comprises a plurality of atomic layers that may mutually overlap. Hence, more in general, the precursor-gas supply may rotate continuously in the same direction, along one and the same part of the substrate a plurality of times, for obtaining a composite layer that comprises a plurality of atomic layers that mutually overlap. Hence, it may be clear that terms like 'rotate(s)' and 'rotating' used herein may mean e.g. 'revolve(s)', respectively, 'revolving', 'gyrate(s)', respectively, 'gyrating', or 'spin(s)', respectively, 'spinning' Hence, an apparatus according to the invention may be arranged for rotating the precursor-gas supply continuously in the same direction, along one and the same part of the substrate a plurality of times, for obtaining a composite layer that comprises a plurality of atomic layers that mutually overlap.

The velocity of relative movement can even be increased if the translational velocity of the precursor-gas supply is directed against a translational velocity of the substrate.

In a variation, the transportation controller and the driving controller are arranged for moving the substrate simultaneously with supplying the precursor gas towards the substrate. In this way, an offset may be realized between subsequently deposited atomic layers. In this way, a seam between edges of atomic layers that extends perpendicularly to the substrate can substantially be prevented. FIG. 1A shows an example of a stack of atomic layers 92.$i$ ($i=n$, $n+1$, . . . ) with offset 93 deposited in this way.

The offset 93 may, more in general, depend on the translational velocity of the precursor-gas supply and of the substrate. It may e.g. be clear that, if the precursor-gas supply 8 and the substrate 4 move in the same direction and the translational velocity of the precursor-gas supply is larger than the translational velocity of the substrate 4, the offset 93 may then decrease if the translational velocity of the precursor-gas supply 8 increases.

In another variation, the transportation controller and the driving controller are arranged for moving the substrate subsequently to supplying the precursor gas towards the substrate. In that case, the substrate is not moved when supplying the precursor gas towards the substrate. When a stack of layers is deposited in this way, supplying the precursor gas towards the substrate may be stopped when moving the substrate. In this way, an isolated stack of layers may be deposited on the substrate 4. FIG. 1B shows an example of isolated stacks 92 of layers 92.$i$ (i=n, n+1, . . . ) deposited in this way. The stack 92 may typically comprise approximately a hundred to a thousand atomic layers, three of which are drawn in FIG. 1B.

The apparatus 2 may further comprise a cover 16. By means of the cover, the precursor gas can be substantially enclosed or confined. The cover 16 faces part of the deposition head and/or the rotatable drum 5 and extends between parts of the substrate 4, in this example parts of the substrate that are in mechanical contact with the capstans 14. With the insertion of cover 16, precursor gas can be substantially enclosed or confined to a space 18 bounded by the deposition head, the substrate 4, and the cover 16. In the space 18, a gas bearing may be created by gas injected from the precursor head, as will later be explained with reference to FIGS. 4-6. Without the cover 16, precursor gas may leak away towards an outer environment 20 of the apparatus 2. This may result in unwanted contamination and particles formed on the substrate.

Figure 1D:
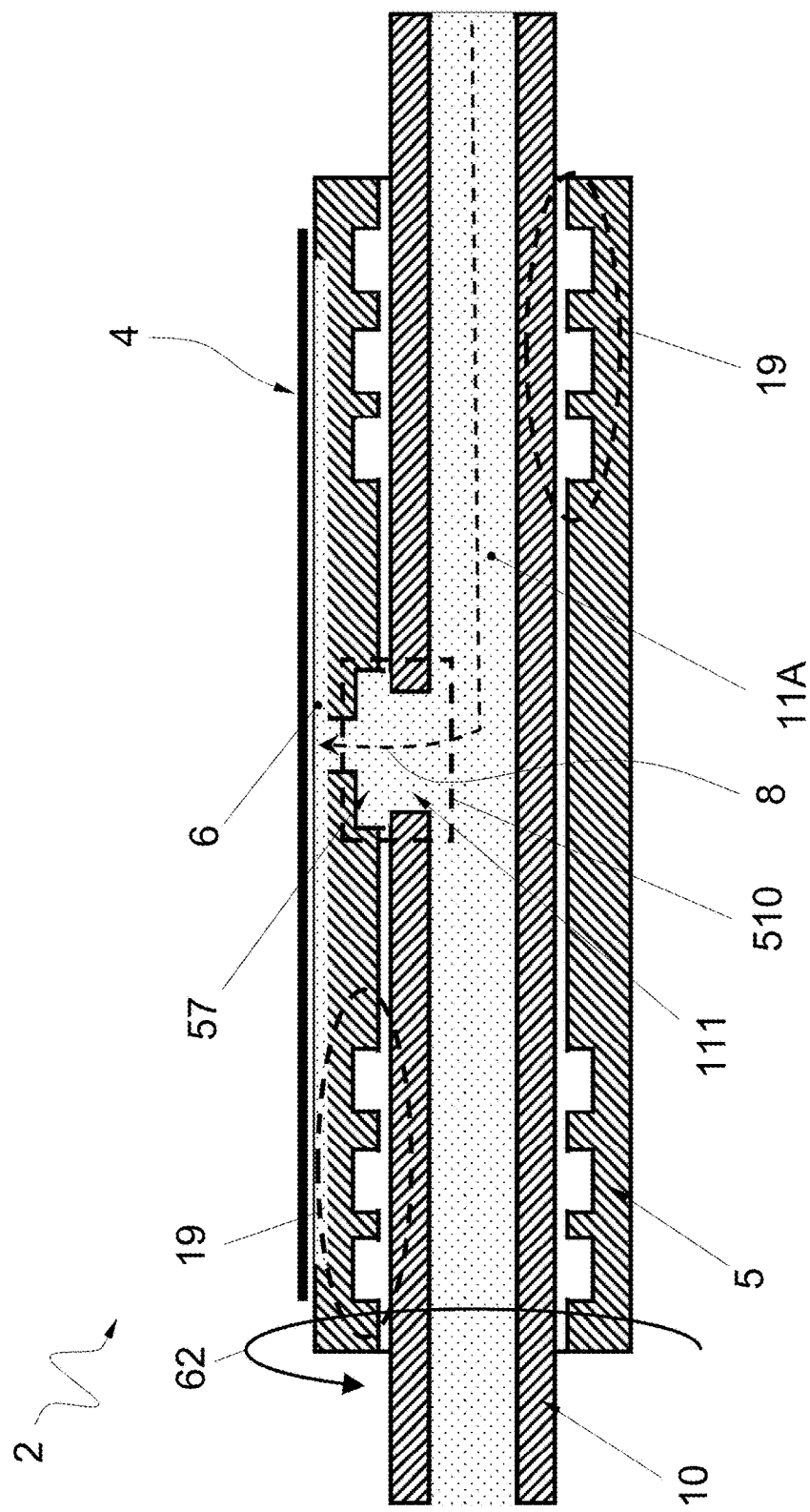
FIG. 1D shows a schematic cross section of an embodiment comprising a gas transition structure.
Figure 1E:
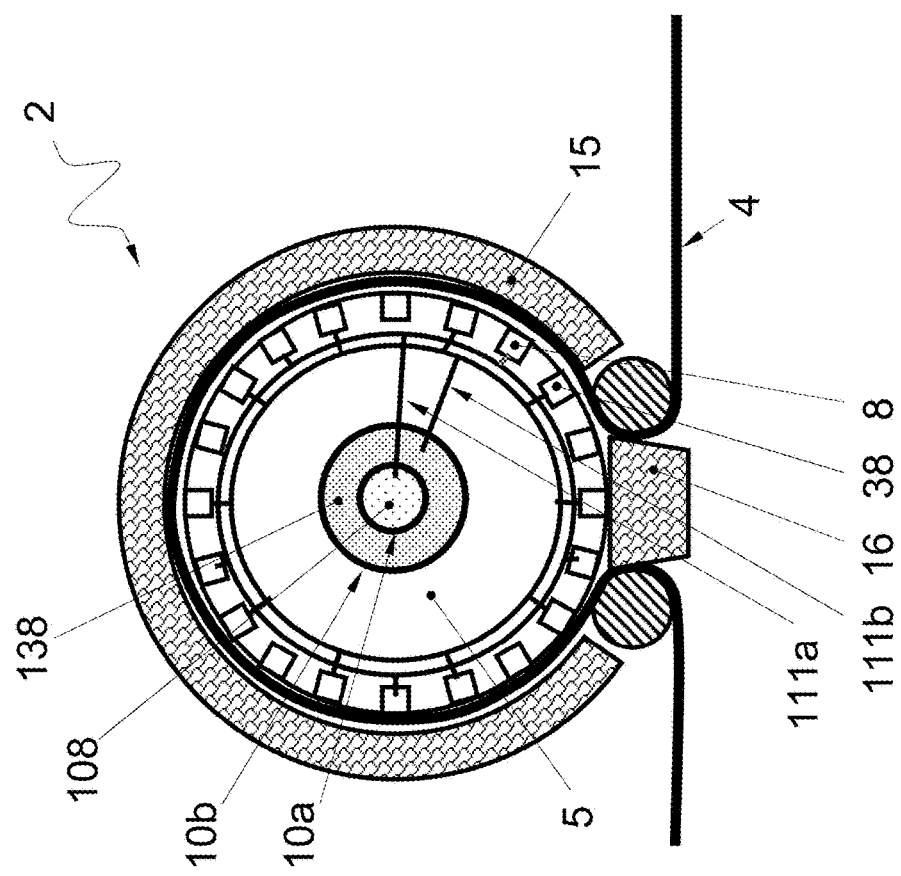
FIG. 1E(A) shows a schematic cross section of another embodiment comprising a gas transition structure.
Figure 1E:
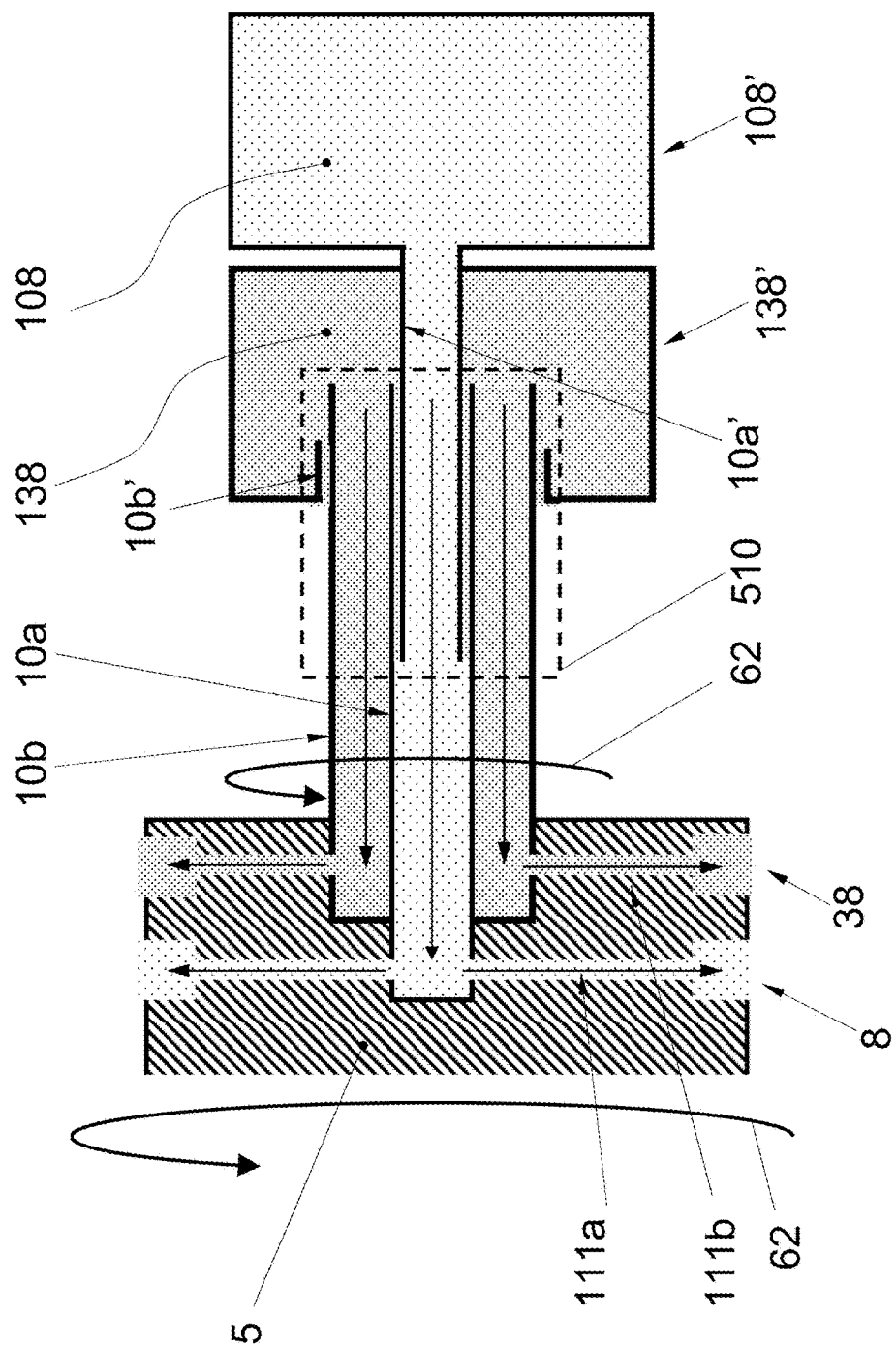
Figure 1E:
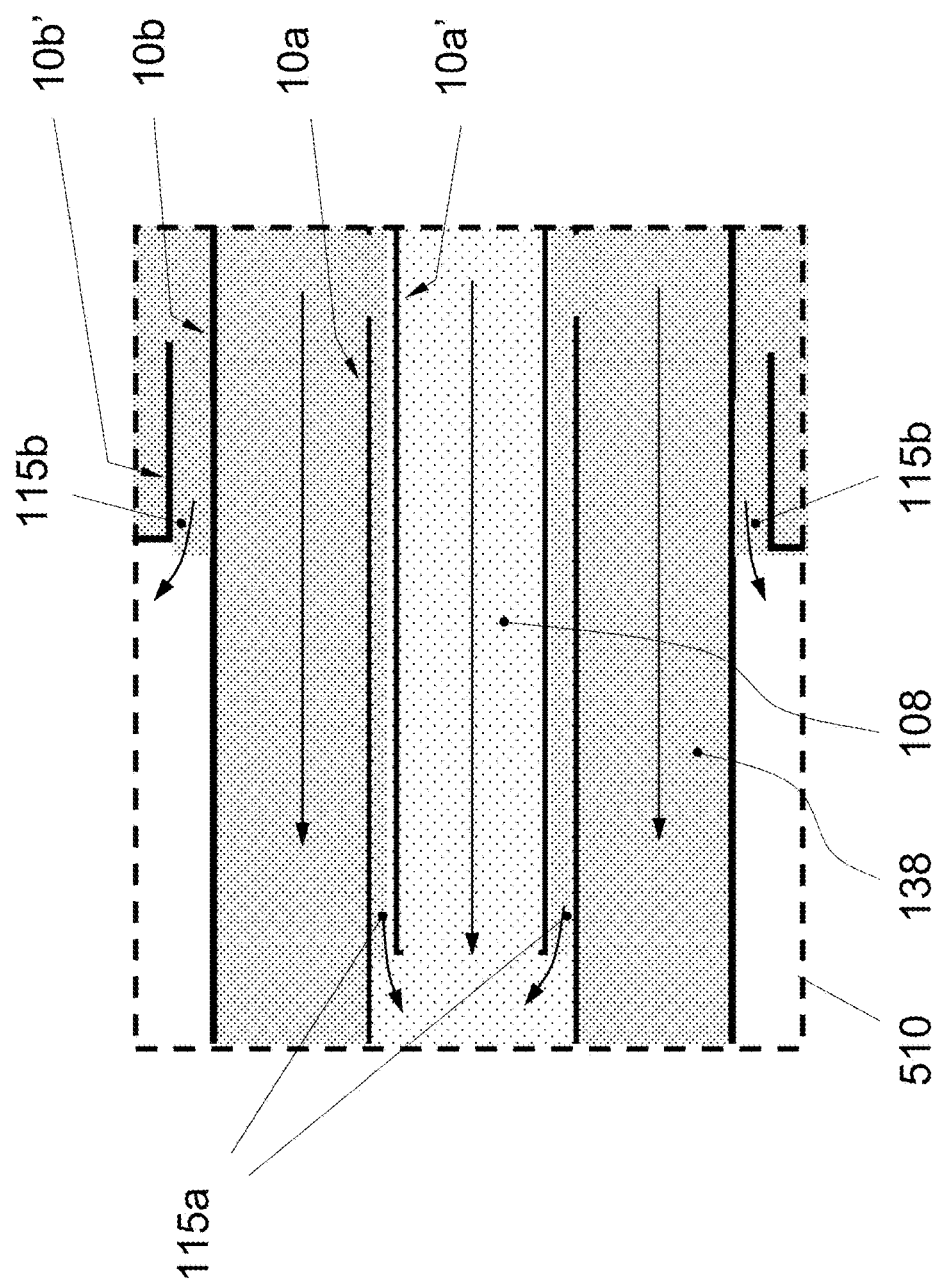
Figure 1F:
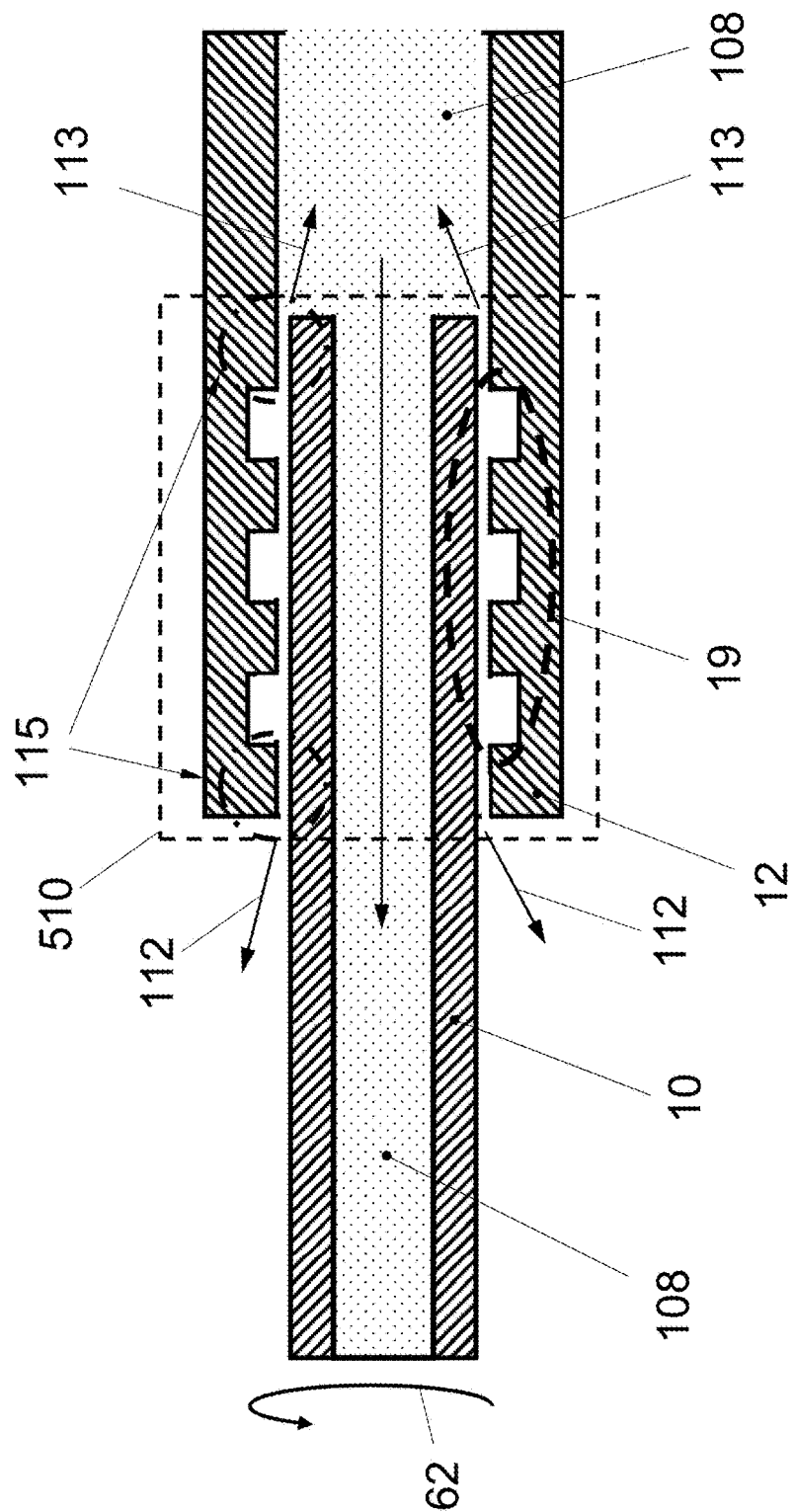
FIG. 1F shows a schematic cross section of yet another gas transition structure.

FIG. 1D shows a schematic cross section of an embodiment of the apparatus 2 comprising a drum 5 that is rotatable around an axle 10 with gas bearings 19. In use, the precursor gas may be transported through the cavity 11A of the axle 10 to provide the precursor gas supply 8 to the substrate 4. The drum 5 may revolve or rotate around the axle 10 in a rotation trajectory 62 while the precursor gas from the precursor gas supply 8 is deposited on the substrate 4 by the deposition head 6 that is comprised in the drum 5. The deposition head 6 may comprise a precursor gas supply 8, and e.g. a narrow slit, in gas contact with the precursor gas supply 8, extending along the surface of the drum 5, e.g. in an axial direction.

To provide the precursor gas from the stationary axle 10 to the revolving drum 5, a gas transition structure 510 is provided. This gas transition structure 510 may comprise e.g. a combination of one or more gas outlets in the axle 10 that are connected to the axle feed-through 111 and one or more corresponding circumferential grooves 57 in the rotatable drum 5. At positions along the rotational trajectory 62 of the drum where the grooves 57 lie opposite the gas outlet, e.g. along the rotation trajectory of the drum, gas may flow between the stationary axle 10 and the rotating drum 5. At positions along the rotational trajectory 62 where the groove is absent or does not lie opposite the gas outlet, the flow of gas may be interrupted or substantially lowered by the surface of the drum that seals the gas outlet.

The term "circumferential grooves" as used herein refers to the fact that the grooves follow a circular path e.g. with a fixed radius that at least partly follows a rotation of a gas inlet or outlet in the drum. The grooves may be semi-circumferential e.g. be interrupted along the circumferential trajectory. While in the current figure the circumferential grooves are on an inner surface of a drum, the grooves may also be on an outer surface of the drum or the axle or, alternatively, the grooves may be on an axial side of the drum, e.g. in a surface of a seal plate held sealingly to a side of the drum (see e.g. FIGS. 15-18).

Alternatively, instead of the drum 5 comprising a groove and the axle 10 a gas outlet, the drum 5 may comprise a gas inlet and the axle 10 may comprise grooves connected to the axle feed-through 111. Alternatively still, both the axle 10 and the drum 5 may comprise circumferential grooves or they may both comprise one or more gas inlets/outlets that are opposite each other during parts of the rotational trajectory 62. Also any other combination of grooves and outlets is possible, e.g. the drum 5 may have grooves that lie opposite gas outlets of the axle 10 as well as the drum 5 having gas inlets that lie opposite grooves in the axle 5. The grooves in the drum 5 or axle 10 may be partly sealed by the surface of the opposing structure, i.e. the axle 10 or drum 5, respectively. These sealed grooves may form channels that function as part of a gas flow path between a gas source connected to the axle cavity 11A and the gas supply 8 that extends in the deposition head 6. The axle 10 may thus act as a sealing piece that seals the gas flow path through the grooves between the sealing piece (axle 10) and the drum 5.

To further improve sealing between the drum 5 and the sealing piece formed by the axle 10, the gas bearings 19 may comprise a purge gas supply for providing a purge or bearing gas (e.g. nitrogen gas, $N_2$) that may provide both a smooth bearing function and a gas curtain between the transition 510 and the external surrounding. The gas curtain may prevent precursor gas from escaping between an opening of the relatively rotating parts of the drum 5 and axle 10. The gas bearing 19 may also be provided with gas drains for draining both the purge gas and the precursor gas. Preferably, the gas bearings 19 comprise grooves that extend along the whole inner circumference of the drum 5 for preventing the precursor gas from escaping the apparatus 2. A pressure of the purge gas is preferably higher than a pressure of the precursor gas. This way the purge gas will flow from the gas bearings 19 towards the precursor gas supply 8 and not the other way around.

Additional gas bearings or purge gas outlets/inlets (not shown here) may be provided between the substrate 4 and the drum 5 for providing a smooth relative movement of the drum 5 and substrate 4 as well as preventing precursor gas from escaping from between the substrate 4 and the drum 5. These additional gas bearings or gas curtains are preferentially provided at the edges of the substrate 4 or deposition head 6. Preferentially, the precursor gas supply and the drains are comprised in a recess or cavity in the deposition head. A concentration of precursor gas in the cavity that is to be deposited on the substrate may be controlled by controlling the pressure of the precursor gas supply and the (suction) pressure of the precursor-gas drains.

Accordingly, an advantageous method may comprise supplying the bearing gas from a bearing-gas supply of the deposition head towards the substrate for providing the gas-bearing layer, and supplying the precursor gas by means of the precursor-gas supply in a cavity that is defined in the deposition head and is facing the substrate, and draining the precursor gas by means of a precursor-gas drain of the deposition head from the cavity for substantially preventing precursor gas to escape from the cavity, the method further comprising supplying the bearing gas by means of the bearing-gas supply at a distance from the cavity.

FIGS. 1E(A)-1E(C) show three views of a rotatable drum 5 with an axle comprising concentric tubes 10a and 10b.

In FIG. 1E(A) a cross-section of a frontal view of the apparatus 2 is shown wherein along the rotational axis of the drum 5, there is provided an inner tube 10a with a precursor gas 108 surrounded by an outer concentric tube 10b with a purge gas 138. The inner tube 10a supplies precursor gas 108 via a radially extending axle feed-through 111a to a precursor gas supplies 8. The outer tube 10b supplies purging gas 138 via a radially extending axle feed through 111b to purge gas supplies 38. The gas supplies 8 and 38 are comprised in the rotating drum 5. The supplies may deposit gas onto a substrate 4 that partially covers the drum. On positions where the substrate does not cover the drum 5, an outer cover 16 may be provided to prevent precursor gasses from escaping the apparatus. On other positions where the substrate 4 follows the circumference of the drum, a guiding structure 15 may be provided to define the substrate path around the drum.

FIG. 1E(B) illustrates how the concentric tubes 10a and 10b, rotating along trajectory 62, may be provided with precursor gas 108 and purge gas 138 from stationary (non-rotating) gas sources 108' and 138', respectively. In particular, a gas transition structure 510 is provided wherein the rotating inner tube 10a receives precursor gas 108 from a stationary tube 10a' that connects to the precursor gas source 108'. Likewise, the rotating outer tube 10b protrudes into a stationary tube 10b' connected to the stationary purge gas supply 138 and receives purge gas there from. Alternative to the shown embodiment, also the purge gas supply may be provided through a combination of a rotating tube sealed by a stationary tube.

In FIG. 1E(C) a zoom-in view is shown of the gas transition structure 510 of FIG. 1E(B). The gas transition structure comprises connections of the inner tubes 10a and 10a' that rotate with respect to each other. E.g. tube 10a, connected to the rotating drum, may rotate while tube 10a', connected to the gas source 108', is held stationary. Preferentially, the purge gas 138 is provided with a higher pressure than the precursor gas 108 such that the precursor gas 108 does not escape the leaky seals or opening 115a between the rotating parts 10a and 10b.

Accordingly in an advantageous embodiment a gas supply 8 or 38 is comprised in a drum 5 that receives gas 108 or 138 from a stationary gas source 108' or 138' via a gas flow path comprising relative rotating parts 10a and 10a' wherein a leakage of the precursor gas through an opening 115 between the relative moving parts 10a and 10a' is prevented by a purge gas 138 provided around said opening having a higher pressure than the precursor gas 108. In a further advantageous embodiment the relative rotating parts comprise two or more concentric tubes 10a, 10b wherein the precursor gas 108 is fed through an inner tube 10a and the purge gas 138 is fed through an outer tube 10b. Alternatively to the concentric tubes, e.g. the gas bearings of FIG. 1D may provide the purge gas at a higher pressure than the precursor gas for preventing a leakage of the precursor gas.

It is to be appreciated that while in the current figure two concentric tubes 10a, 10b are shown for supplying the precursor and purge gasses, additional concentric tubes may be provided, e.g. to drain the gasses. E.g. such a drain may have a lower pressure than both the precursor gas and be provided in a tube within the currently shown inner tube. Alternatively, the tube may be provided concentrically around the outer tube, e.g. at a pressure below atmospheric pressure, such that any leaky seals of the drain will not leak the gas to the external surrounding but in stead will suck atmospheric gasses into the drain tube. Additionally or alternatively, any number of concentric tubes may be provided, e.g. in an alternating pressure arrangement wherein purge gas tubes are provided with a high pressure between two or more precursor gasses. It is noted that for the current embodiment the tubes need only be concentric at the position where the parts rotate with respect to each other, i.e. the gas transition structure 510. E.g. over a part of the axle the concentric tubes may connect to an arrangement of parallel tubes.

It is noted that also the outer tubes 10b and 10b' may rotate with respect to each other. Escape of the (inert) purge gas 138 to the external surroundings may occur through opening 115b between the tube 10b that may be rotating with respect to the stationary tube 10b' connected to the purge gas supply.

FIG. 1F shows a schematic cross section of two connecting concentric gas tubes for transporting a precursor gas 108. The inner tube may e.g. form an axle 10 of a rotating drum and is rotatable with respect to the outer tube that may form a bearing 12 for holding the axle 10. The gas transition structure 510 may thus be formed between the relatively rotating parts of the axle 10 and bearing 12. A leakage of the precursor gas 108 through an opening 115 between the relative moving parts 10 and 12 is prevented by a purge gas provided around said opening by the gas bearings 19. Preferably the purge gas has a higher pressure than the precursor gas 108. In this way the gas bearing or purge gas will flow in direction 113 into the tube or bearing 12 preventing the flow of precursor gas to the external surroundings, e.g. in direction 112.

FIG. 2A schematically shows a basic functional part of the deposition head 6 of the apparatus 2 in the first embodiment, and the substrate 4. FIG. 2A illustrates how, along an output face 26 of the precursor head 6, gasses may be supplied and drained. In FIG. 2A, arrow 28.1 indicates supply of the precursor gas. Arrow 28.2 indicates draining of the precursor gas and purge gas supplied by 30.1. Arrow 30.1 indicates supply of the purge gas. Arrow 30.2 indicates draining of the purge gas and precursor/reactant gas supplied by 32.1. Arrow 32.1 indicates supply of the reactant gas. Arrow 32.2 indicates draining of the reactant gas and purge gas supplied by neighboring 30.1. The supply of purge gas in between location of supply of active gasses, e.g. the reactant gas and the precursor gas, in use spatially divides the active gasses. The basic functional part shown in FIG. 2A may be repeated along the circumference of the rotatable drum 5. Hence, more in general, the precursor-gas supply is located, and preferably repeated, along the circumference of the rotatable drum and/or along the circumference of the output face.

FIG. 2B partly shows a possible structure of the part of the deposition head shown in FIG. 2A. FIG. 2B shows the precursor-gas supply 8, which can be used for a first reaction half-cycle. FIG. 2B further shows that the deposition head may have a precursor-gas drain 36 for draining of the precursor gas. The deposition head 6 may further have a purge-gas supply 38 and a purge-gas drain 40, for respectively supplying the purge gas towards the substrate and draining the purge gas away from the substrate. The deposition head may further have a reactant-gas supply 42 for supplying the reactant gas towards the substrate 4, which can be used for the second reaction half-cycle. The reactant gas supply functions as a means to have the precursor-gas react near, e.g. on, the substrate so as to complete the formation of an atomic layer. It may be clear that in this way the purge gas is supplied in between the reactant gas and the precursor gas in order to spatially divide zones associated with respectively the reactant gas and the precursor gas. This may prevent reaction of the purge gas and the reaction gas at positions other than on the substrate 4. In addition, or alternatively, other reactant systems may be used, for example, thermal, photonic or plasma excitation.

More in general, gas supplies, e.g. the precursor-gas supply, the reactant-gas supply, and the purge-gas supply may be spaced apart from each other and from gas drains, e.g. the precursor-gas drain, the reactant-gas drain, and the purge-gas drain, by a separation length 43.

FIGS. 3A and 3B show a part of the transporter 17. FIGS. 3A and 3B show the guide 15 comprised by the transporter. In use, the precursor-gas supply may rotate inside a central space 49 that may be enclosed by the guide 15. The guide 15 may have a mesh 48 attached to an inner lining of the guide or closure element 15. The transporter may further comprise a carrier 50 for attaching the substrate 4 thereto by means of pressure. The carrier 50 may comprise a mesh. Thereto the transporter may comprise a vacuum port 52 for creating a vacuum between the substrate 4 and the carrier 50. Arrow 54 indicates how gas can be sucked away through the vacuum port 52 to attach the substrate 4 to the carrier 50. In use, the carrier can be moved around the guide 15, along a transportation face 56 of the guide 15 that is conformal with the output face 26. Other methods of attaching the substrate to the carrier 50 are possible as well.

FIG. 4 shows an apparatus 2 for depositing an atomic layer on a substrate 4, in a second embodiment according to the invention. FIG. 4 shows the deposition head 6 and the cover 16 of the apparatus 2. A moving direction of the substrate 4 is indicated by arrows 60. A rotating direction of the deposition head, and a moving direction of the precursor-gas supply along the substrate, is indicated by arrow 62. It may thus be clear that in this example the translational velocity of the precursor-gas supply is directed in a direction of the translational velocity of the substrate. If, for example, the substrate would move in the direction of arrow 64, the translational velocity of the precursor-gas supply along the substrate would be directed against the translational velocity of the substrate.

The apparatus 2 in the second embodiment further shows the output face 26 of the deposition head 6. In FIG. 4, the output face in use faces a part of the substrate 4. In FIG. 4, the output face faces substantially either the substrate 4 or the cover 16. The output face 26 may have a substantially cylindrical shape. It may be clear that in this example the output face 26 defines a movement path of the substrate, as in use the output face is separated from the substrate by a separation distance D (see also FIG. 2A). It may further be clear that the output face 26 in this example is substantially rounded along the entire circumference of the output face 26 around the axis of rotation of the deposition head. In other examples however, the output face 26 may e.g. be flat over part of the circumference of the output face 26 around the axis of rotation of the deposition head. Hence, more in general, the output face may be substantially rounded along at least part of the circumference of the output face around the axis of rotation of the deposition head and/or around the axis of rotation of the drum.

The output face 26 may be provided with the precursor-gas supply 8, in this example with a plurality of precursor-gas supplies 8. The output face 26 may further be provided with the precursor-gas drain 36, in this example with a plurality of precursor-gas drains 36. The output face 26 may further be provided with the purge-gas supply 38, in this example with a plurality of precursor-gas supplies 38. The output face 26 may further be provided with the purge-gas drain 40, in the example with a plurality of purge-gas drain 40. The output face 26 may further be provided with the reactant-gas supply 42, in this example with a plurality of reactant-gas supplies 42. The output face 26 may further be provided with a reactant-gas drain 68, in this example with a plurality of reactant-gas drains 68.

There are, in this example, three groupings of gas supplies, and two groupings of drains. Each precursor gas supply grouping has a corresponding drain grouping, which may also drain the surrounding purge gas. It may not be necessary to provide a separate drains for purge gas since the purge gas does not react with the precursor gasses. Optionally, there may also be provided more than two precursors gas supply groupings, in which case there are preferably enough corresponding drain groupings to keep those (pairs of) precursor gasses that may react with each other separated. The number of drain groupings) is preferably at least equal the number of precursor groupings. Generally, the drain grouping for each precursor is kept separate from all other groupings to prevent CVD (chemical vapor deposition) reactions in the apparatus, which can result in particle generation or even blockage of gas channels.

The gas supplies 8, 38, 42 and/or the gas drains 36, 40, 68 may be elongatedly shaped, i.e. shaped in elongated form, in an axial direction of the deposition head 6 and the drum 5. An array of gas supplies, e.g. precursor-gas supplies, may be regarded as a gas supply, e.g. a precursor-gas supply, being shaped in elongated form. In general, the axial direction may be aligned with, or coincide with, the axis of rotation of the deposition head. Hence, it may, more in general, be clear that the axis of rotation of the deposition head may coincide with an axis of rotation of the drum.

FIG. 4A shows an example of the output face provided with the elongatedly shaped supplies. The axial direction 65 may be directed along the substrate 4 and transverse to a moving direction 66 of the supplies and/or to the moving direction 60 of the substrate 4. This moving direction is to be evaluated adjacent to the supply.

In use, the precursor gas, the reactant gas, and the purge gas may form a gas bearing between the substrate 4 and the output face 26. Thereto the apparatus 2 may comprise a gas controller for controlling the supply and drainage of the precursor gas, the reactant gas, and/or the purge gas, thus supplying gasses for forming a gas-bearing layer 69 of the gas bearing between the substrate 4 and the output face 26. By means of such a gas-bearing layer, the substrate can be separated from the deposition head. In this way, mechanical contact between the output face 26 and the substrate 4 can substantially be prevented. This allows the translational velocity of the precursor-gas supply and the translational velocity of the substrate to have a different magnitude and/or a different direction. In this example, the purge-gas supply functions as a bearing-gas supply 70 for supplying the bearing gas, e.g. the purge gas, between the deposition head and the substrate for forming the gas-bearing layer 69 that separates the substrate and the deposition head. Thus, in this example, the deposition head comprises the bearing-gas supply, being arranged for supplying the bearing gas towards the substrate for providing the gas-bearing layer 69. It may be clear that, in this example, the purge-gas drain 40 functions as a bearing-gas drain 72, and precursor drain. It may also be clear that the separation distance D may be representative for a thickness of the gas bearing layer between the substrate 4 and a surface of the output face 26.

More in general, the gas-bearing layer in use typically shows a strong increase of the pressure in the gas-bearing layer as a result of the close proximity of the substrate 4 towards the output face 26. For example, in use the pressure in the gas-bearing layer at least doubles, for example typically increases eight times, when the substrate moves two times closer to the output face, ceteris paribus. Preferably, a stiffness of the gas-bearing layer in use is mostly between $10^4$ and $10^9$ Newton per meter, but can also be outside this range. In use, the substrate 4 may float against the gas-bearing layer.

More in general, the apparatus may be arranged for applying a pre-stressing force on the substrate directed towards the deposition head. In use, the pre-stressing force increases a stiffness of the gas-bearing layer. Such an increased stiffness reduces unwanted movement out of a plane of the substrate surface. As a result, the substrate can be provided more closely to the substrate surface, without touching the substrate surface. The pre-stressing force may e.g. be applied by a (pre)tensioning the substrate 4, for instance, by a spring guide, such as a capstan that is pretensioned. The spring guide may be somewhat distanced from the capstans 14. Other ways of applying the pre-stressing force are possible as well.

In variations of the apparatus 2 in the second embodiment, e.g. as shown in FIGS. 5 and 6, the deposition head may be provided with a cavity 74 that, in use, faces the substrate 4. Such variations may, in addition to the rotatable deposition head 6 of the second embodiment, also relate to a deposition head with a planar or curved output face 26 that is, in use, moved linearly along the substrate 4 or is stationary positioned while the substrate 4 is in motion. A depth of the cavity 74 may be defined as a local increase in distance between the output face 26 and the substrate 4. In FIG. 5 this increase in distance equals $D_2$ minus $D_1$, wherein $D_1$ is a distance between the output face 26 and the substrate 4 adjacent to the bearing-gas supply 70 and $D_2$ is a distance between the output face 26 and the substrate 4 adjacent to the precursor-gas supply 8. More in general, $D_2$ minus $D_1$ may be in a range from 10 to 500 micrometers, more preferably in a range from 10 to 100 micrometers.

In the examples of FIGS. 5 and 6, the precursor-gas supply 8 is positioned in the cavity 74 for supplying the precursor gas in the cavity 74 towards the substrate 4. The deposition head 6 may further be provided with the precursor-gas drains 36 that are positioned in the cavity 74 for draining the precursor gas from the cavity 74. The deposition head 6 may further be provided with the bearing-gas supply 70 spaced apart from the cavity for supplying the bearing gas at a distance from the cavity.

In FIGS. 5 and 6, the curvature of the cylindrically shaped output face 26 and the substrate is not shown for clarity. Furthermore, in these examples, the precursor-gas drains 36 also form the bearing-gas drains 72. It may be clear, however, that more in general, the bearing-gas drains 72 may be separate from the precursor-gas drains. The bearing-gas drains may be spaced apart from the cavity 74, i.e. the bearing-gas drains 36 may be positioned outside the cavity 74. Thus, in FIG. 6, the output face 26 is provided with the plurality of precursor-gas drains 36, a plurality of the cavities 74, and the plurality of bearing-gas supplies 70. Depth of cavity 74 can also be zero, which means that there is no cavity. Precursor gas/region 77A can have gas bearing functionality (i.e. stiffness between precursor supply and substrate).

FIGS. 5 and 6 also show the gas-bearing layer 69, which may be substantially located outside the cavity 74. Flow of the bearing gas in the gas-bearing layer is indicated with arrows 75. FIGS. 5 and 6 also show a deposition space 77A that extends from the cavity towards the substrate 4. Because the precursor-gas supply 8 and the precursor-gas drains 36 are positioned in the cavity, the precursor gas may in use be substantially confined to the deposition space 77A. Flow of the precursor gas in the deposition space is indicated with arrows 78. FIG. 6 also shows reactant spaces 77B.

FIG. 6A shows another variation of the deposition head 6 in the second embodiment. In this variation, the apparatus comprises a selectively controllable laser 79 for reacting the precursor gas on the substrate 4 so as to form (or re-form) the atomic layer by selectively controlling the laser 79. Thereto the apparatus may comprise a laser controller. The laser controller may work together with the transportation controller, the driving controller, and/or the pressure controller. In this way, an intended, e.g. predetermined, pattern of an atomic layer or a stack of atomic layers may be deposited. Controlling the laser may be dependent on the translational velocity of the substrate and the translational velocity of the precursor-gas supply. E.g., moments at which the laser is turned on and/or off may be dependent on the translational velocity of the substrate and the translational velocity of the precursor-gas supply. Using a laser may be especially useful in combination with the rotating deposition head. A laser may be selectively controlled at relatively high frequencies that may suit the relatively fast deposition process enabled by the rotating deposition head.

FIG. 6A also shows the precursor-gas drain 36. Although not drawn in FIG. 6A, it may be clear that the deposition head may also be provided with the purge-gas supply 38 and the purge-gas drain 40. More in general, the deposition head may be provided with a plurality of lasers 79 or tunable wavelength lasers to induce wavelength-specific reaction. According to the variation of FIG. 6A, the plurality of reactant-gas supplies 42 as shown in FIG. 4 may e.g. be replaced by the plurality of lasers 79.

FIG. 7 shows an apparatus 2 in a third embodiment according to the invention, in assembly with the substrate 4. The apparatus 2 in the third embodiment may be provided with the axle 10 and the bearing 12, and may also have the output face 26. In FIG. 7, the moving direction 60 of the substrate 4 is directed against the moving direction 62 of the precursor-gas supply, which may rotate along with the rotatable wheel of the drum 5 (the wheel is not shown in FIG. 7 but is shown in FIG. 1 with reference number 5'). In FIG. 7, the substrate 4 is provided along a helical path 76 around the output face 26 of the deposition head 6. In FIG. 7, the substrate is provided less than once around the deposition head 6, i.e. around the output face 26 of the deposition head. More in general, the axis of rotation of the deposition head and/or the length axis of the axle 12 of the apparatus 2, may be inclined with respect to the length axis of one or both of the capstans 14. In this way, it may be obtained that the substrate 4 is provided along the helical path 76.

FIG. 8 shows an apparatus 2 in a fourth embodiment according to the invention, in assembly with the substrate 4. In this example, the substrate 4 is provided at least once, i.e. between two and three times, around the output face 26 of the deposition head 6 along a helical path 76. Or, in other words, the substrate makes at least one turn, i.e. between two and three turns, around the deposition head 6 along the output face 26. As a result, at a moment in time, a first part 80A of the substrate 4 that is to be moved around the rotating deposition head at least once is located besides a second part 80B of the substrate 4 that has moved around the rotating substrate one time more than the first part 80A of the substrate 4. Here, the term 'besides' may be interpreted in such a way that the first part 80A and the second part 80B of the substrate extend along the same imaginary line 82 that is directed along the first part 80A and the second part 80B of the substrate 4 and transverse to the moving direction 60 of the substrate 4. A cover (not shown) may be a helically formed shield structure following the helical path form of the substrate and covering the slit or gap 84 formed between mutually opposed sides of the substrate. The shield structure may be formed as a cleanable liner structure or a sacrificial structure, In addition, suction may be provided in the shielding structure to remove escaping process gases.

In the fourth embodiment, the apparatus 2 may be provided with a leaked-gas drain for draining the precursor gas that has leaked through the gap 84 between the first part 80A and the second part 80B of the substrate 4 forming mutually opposed sides 80A and 80B, respectively.

In FIG. 8, positions 88 are indicated along the circumference of the output face 26 where the precursor-gas supplies 8 may be positioned. In this example, the deposition head 6 is provided with four precursor supplies 8. As in this example the substrate 8 faces the whole of the precursor supplies 8, the precursor supplies 8 are not visible in this example. Hence, more in general, at least one precursor-gas supply may be positioned along the circumference of the output face.

As may be clear from FIG. 8, a width $W_1$ of the substrate 4 may be substantially smaller, e.g. at least two times smaller, than a width $W_2$ of the deposition head 6. However, alternatively, the width $W_1$ of the substrate 4 may be approximately equal to the width $W_2$ of the deposition head 6. This is visible in FIGS. 7 and 9. As another example, the width $W_1$ of the substrate 4 may be substantially larger, i.e. at least two times larger, than the width $W_2$ of the deposition head 6. In practice, all such alternatives may form valuable options for deposition one or more atomic layers.

The apparatus 2 in the first, second, third, fourth, or another embodiment, or a variation of one of these embodiments, can be used according to a method according to the invention.

A first embodiment of a method of depositing an atomic layer on a substrate according to the invention (the first method), comprises the step of supplying a precursor gas from the precursor-gas supply 8 of the deposition head 6 towards the substrate 4. The first method further comprises moving the precursor-gas supply 8 along the substrate by rotating the deposition head 6. The first method may comprise moving the substrate 4 along the precursor-gas supply 8 subsequently to and/or simultaneously with supplying the precursor gas towards the substrate 4.

In the first method, the translational velocity of the precursor-gas supply is larger than and/or is directed against a translational velocity of the substrate. The absolute value of the translational velocity of the precursor-gas supply may e.g. by at least 5 times, at least 10 times, at least 20 times, at least 50 times, at least 100 times, at least 500 times, at least 1,000 times, at least 5,000 times, and/or at least 10,000 times larger that the translational velocity of the substrate. More in general, it may be clear that if the translational velocity of the precursor-gas supply is at least N times larger than the translational velocity of the substrate, a stacked layer comprising N-1 atomic layers may be deposited.

The first method may further comprise confining the precursor gas by means of the cover 16. Thereto the cover 16 may face the output face 26 of the deposition head at locations where the substrate does not face the deposition head.

In the first method or in another method according to the invention, the separation distance D (FIG. 2A) between the substrate and the rotating deposition head may be maintained. Mechanical contact between the substrate 4 and the rotating deposition head may be prevented in this way. The separation distance D may be substantially constant around at least a part, and preferably all, of the circumference of the deposition head. The separation D may be obtained in various ways.

A second embodiment of a method according to the invention (the second method), may comprise attaching the substrate to the carrier 50. The second method may comprise moving the carrier 50 along the precursor-gas supply 8. In this way the substrate can be kept at a distance from the output face 26 of the deposition head 6. The second method may comprise moving the carrier around the guide 15 along the transportation face 56 of the guide 15. The transportation face 56 may be conformal with the output face 26 and is facing the output face 26, so that the separation distance D can be kept constant over at least part of the output face 26.

A third embodiment of a method according to the invention (the third method), may comprise supplying a bearing gas between the deposition head and the substrate for forming the gas-bearing layer 69 that separates the substrate and the deposition head. In this way the substrate can be kept at a distance from the output face 26 of the deposition head 6. The third method may comprise supplying the bearing gas from the plurality of bearing-gas supplies 70 of the deposition head 6 towards the substrate 4 for providing the gas-bearing layer.

The third method may further comprise supplying the precursor gas by means of the precursor-gas supplies 70 in the cavity 74 that is defined in the deposition head 6 and is in use facing the substrate 4. The third method may comprise draining the precursor gas by means of the plurality of precursor-gas drains 72 of the deposition head 6 from the cavity 74. In this way, escape of the precursor gas from the cavity, i.e. flow of the precursor gas out of the cavity otherwise than through the precursor drain, may be substantially prevented. In the third method, the bearing gas is preferably provided by means of the bearing-gas supplies 70 at a distance from the cavity. Thereto the bearing-gas supplies 70 may be spaced apart from the cavities 74 along the output face 26.

A fourth embodiment of a method according to the invention (the fourth method) may comprise moving the substrate along the helical path 76 around the deposition head 6. FIG. 9 schematically shows the moving direction 60 of the substrate 4 and the moving direction 62 of the deposition head 6. Tracks 90.$i$ ($i$= . . . , n−1, n, n+1, . . . ) of a center 8' of the precursor-gas supplies 8 along the substrate 4 are shown. A higher index i indicates that movement along that track happens later in time. The tracks 90.$i$ can be expected to form substantially straight lines on the substrate 4. It may be clear that neighboring tracks, e.g. tracks 90.$n$ and track 90.$n$+1, may correspond to neighboring precursor-gas supplies 8.

FIG. 9 further shows a length L of the precursor-gas supplies along a longitudinal direction 89 of the precursor-gas supplies 8, that may e.g. be shaped in elongated form. In this example the longitudinal direction 89 is aligned with respect to the axis of rotation 91 of the deposition head, although this is not necessary. E.g., the longitudinal direction 89 may alternatively coincide with the length axis 87 of at least one of the capstans 14.

The length axis 87 of at least one of the capstans 14 and/or the longitudinal direction 89 may be transverse, e.g. perpendicular, to the moving direction of the substrate 60. An angle of inclination α may be defined between the length axis 87 of at least one of the capstans 14 and the axis of rotation 91 of the deposition head 6.

A separation S can be defined between centers 8' of neighboring precursor-gas supplies 8. In an embodiment, the length L of the precursor-gas supplies 8 and the translation velocities of the substrate and the precursor-gas supplies, may be chosen such that atomic layers deposited by neighboring tracks 90.*i* overlap or abut each other. In this way a gap between these atomic layer may be substantially prevented.

A reactant-gas supply 42 may be similarly shaped as the precursor-gas supply 8. A location of the reactant-gas supply 42 may be offset with respect to the precursor-gas supply 8 over a distance R along the axis of rotation 91. It may be clear that the distance R may be adapted so that a center 42' of the reactant-gas supply 42 follows a similar track 90.*i* along the substrate as followed by a precursor-gas supply 8 that neighbors that reactant-gas supply 42. A similar offset can be realized for neighboring precursor-gas supplies so that a stack of layers can be deposited from neighboring precursor-gas supplies. FIG. 9 illustrates that, as a result of helical arrangements, various possibilities are provided for coverage of the substrate with an atomic layer. In particular, atomic layer stack geometries may be deposited that distinguish themselves as a result of their (edge) geometry. In particular, a coverage of the substrate near an edge of the substrate may be different from a coverage obtained using known methods.

Hence, it may be clear that a precursor-gas supply or an array of precursor-gas supplies may extend along a helical path over the output surface. FIG. 9A shows an embodiment of a deposition head 6 of an apparatus according to the invention, wherein a precursor-gas supply extends along a helical path 76A. FIG. 9A also shows the axis of rotation 91. FIG. 9B shows a part of a cross-section A-A' as indicated in FIG. 9A. A precursor-gas drain 36 or an array of precursor-gas drains may extend along the helical path 76A, e.g. in parallel with the precursor-gas supply 8 or the array of precursor-gas supplies 8. The precursor-gas supply and/or the precursor-gas drain may be shaped in elongated form (an array of precursor-gas supplies may be regarded as a precursor-gas supply being shaped in elongated form). A longitudinal direction of said elongated form may extend along the helical path 76A over the output surface, and in this example more than once around the axis of rotation. Hence, the precursor-gas supply may be shaped in elongated form inclined to an axial direction of the deposition head. Thus, more in general, a precursor-gas supply or an array of precursor-gas supplies, and a precursor-gas drain or an array of precursor-gas drains, may extend along a helical path. The deposition head may be provided with a helical cavity 74'. The helical cavity 74' may, in use, faces the substrate. The precursor-gas supply 8 or the array of precursor-gas supplies 8 may be preferably positioned in the helical cavity 74' for supplying the precursor gas in the helical cavity 74' towards the substrate. The precursor-gas drain 36 or the array of precursor-gas drains 36 may be preferably positioned in the helical cavity 74' for draining the precursor gas from the cavity 74'.

In an embodiment, draining the precursor gas by means of the precursor-drain 36 may be omitted. The precursor-drain 36 may be absent in the helical cavity 74' along the helical path 76A or may be unused. Omitting draining the precursor gas through the drain 36 may be enabled by the precursor-gas supply extending along the helical path 76A. Draining of the precursor-gas through the helical cavity may occur as a result of rotation of the deposition head 6. Such may result from the arrangement of the precursor-gas supply in the helical cavity 74' along the helical path 76A. At an end 74" of the helical cavity 74', a provision for collecting drained precursor gas may be provided.

In a variation the fourth method may comprise, when moving the substrate 4 along the precursor-gas supply 8, moving the substrate 4 at least once around the deposition head 6. As a result, at a moment in time, the first part 80A of the substrate that is to be moved around the rotating deposition head at least once is located besides the second part 80B of the substrate 4 that has moved around the rotating substrate one time more than the first part 80A of the substrate, so that the first and second part of the substrate extend along the same line that is directed along the first and second part of the substrate and transverse to a moving direction of the substrate. The fourth method may further comprise draining the precursor gas that has leaked through the gap 84 between the first part 80A and second part 80B of the substrate 4.

The first, second, third, and fourth method may enable depositing a continuous stack of atomic layers, i.e. a stack of atomic layers wherein a seam between edges of two laterally neighbouring atomic layers may be prevented. However, when carrying out a method according to the invention, such a continuous stack of atomic layers does not necessarily have to be achieved. For example, a fifth embodiment of a method according to the invention (the fifth method) may comprise depositing a stack 92 of atomic layers on the substrate, comprises realizing relative reciprocating motion between the precursor-gas supply and the substrate, which reciprocating motion comprises back-turning or reversing a direction of motion between the precursor-gas supply and the substrate at two subsequent back-turning positions. FIG. 10 illustrates the fifth method.

FIG. 10 shows the stack of layers 92 and shows subsequent back-turning positions 94.*i* (i= . . . , n−1, n, n+1, . . . ). Herein a higher index i corresponds with a later moment in time. In FIG. 10, the layers are shown at a distance from the substrate 4 in order to indicate the moment in time at which they are deposited (indicated by the time axis 96). However, in reality, the various layers 92 will be present on the substrate 4 (as indicated by arrow 97), so that a stack of layers will be obtained with a substantially constant layer thickness 98.

In the fifth method, for example, during deposition the deposition head 6 may be rotated back and forth. Optionally, the substrate 4 may also be moved back and forth, i.e. in opposite directions 60, 64. In this way, the fifth method may comprise realizing relative reciprocating motion between the precursor-gas supply 8 and the substrate 4. Such reciprocating motion may comprise back-turning a direction of motion between the precursor-gas supply and the substrate at two subsequent back-turning positions. The two back-turning positions 94.*n*−1 and 94.*n* can be regarded as subsequent back-turning positions, as well as the two back-turning positions 94.*n* and 94.*n*+1.

An atomic layer 92A may be deposited between the back-turning positions 94.*n*−1 and 94.*n*. This atomic layer 92A may be offset with respect to a previously deposited atomic layer 92B. This means that an edge 100A of the atomic layer 92A deposited between the back-turning positions 94.*n*−1 and 94.*n* is laterally, i.e. in a direction in which the substrate 4 extends, displaced with respect to an edge 100B of the previously deposited atomic layer 92B.

As a result of the offset, the edge 100A of the atomic layer 92A deposited between the back-turning positions is at a different position from the substrate than a main part 102A of the atomic layer 98A deposited between the back-turning positions.

However, despite the offset, the edge 100A of the atomic layer deposited between the subsequent back-turning positions 94.$n$–1 and 94.$n$ may be adjacent to an edge of an atomic layer deposited between the subsequent back-turning positions 94.$n$ and 94.$n$.1. The main parts of these layers are similarly positioned from the substrate.

The fifth method may also be carried out by linearly moving the deposition head 6, instead of a rotating the deposition head 6.

It may be clear from the above and from FIGS. 1-11B that, more in general, a method according to the invention preferably comprises moving the substrate along a, preferably at least partly rounded, circumference of a rotatable drum, in particular of a rotating drum. An apparatus according to the invention preferably is arranged for moving the substrate along a, preferably at least partly rounded, circumference of a rotatable drum.

In a generally applicable but optional embodiment, the output face and/or the drum may, for at least a part of the output face and/or the drum or for the whole of the output face and/or the drum, have a substantially cylindrical, conical, or frustum shape or may be substantially shaped as at least a part of a cylinder, a cone, or a frustum.

The inventors realized that the invention may e.g. be used in the field of manufacture of packages. A package may e.g. be packages for food, in particular packages for beverages. Alternatively, a package may be a package of a display, in particular an organic light emitting diode display. A method according to the invention may optionally comprise depositing an atomic layer, preferably a stack of atomic layers, on a package sheet. An apparatus according to the invention may optionally be arranged for depositing an atomic layer, preferably a stack of atomic layers, on a package sheet. Hence, the substrate may optionally be a package sheet. Such a package sheet may be part of a package or may be arranged for forming a package there from. By means of atomic layers, a barrier for gas (e.g. oxygen or water vapour) and/or fluids may be formed on the package. A barrier comprising atomic layers may provide a relatively reliable seal. Leakage through a barrier comprising atomic layers may be relatively low.

It may be clear from the above and from FIGS. 1-11B that, more in general, an axis of rotation of the deposition head and/or the drum may be directed along, or may be directed inclined with, the output face and/or a plane of a substrate surface on which the atomic layer is to be deposited.

It may also be clear from the above and from FIGS. 1-11B that the precursor-gas supply may extend, along a curved output face, in a direction along or inclined with the axis of rotation of the deposition head. This may enable homogeneous deposition of an atomic layer on the substrate.

It may be further clear from the above and from FIGS. 1-11B that an apparatus according to the invention may comprise, and/or a method according to the invention may be carried out using: an output face that extends along and/or over an, at least partly rounded, circumference of the drum; a precursor-gas supply that is positioned on an, at least partly rounded, circumference of the drum; a precursor-gas supply that is positioned on an, at least partly rounded, circumference of the output face; an output face that is, at least partly, substantially rounded around the axis of rotation of the deposition head and/or an axis of rotation of the drum; a mount for rotatably mounting a drum that comprises the deposition head; a deposition head that is part of a rotatable drum; a precursor-gas supply that extends over a curved output face; and/or a deposition head having an axial direction and/or axis of rotation that is directed along with or inclined to the substrate, wherein an angle of inclination between the substrate and the axis of rotation preferably is smaller than 30 degrees. Additionally or alternatively, a method according to the invention may comprise: providing the deposition head and/or the drum mounted on an axle, and providing at least the precursor gas through the axle towards the precursor-gas supply.

Thus, the invention provides a method of depositing an atomic layer on a substrate, which method comprises supplying a precursor gas from a precursor-gas supply comprised by a deposition head towards the substrate; having the precursor gas react near, e.g. on, the substrate so as to form an atomic layer, and further comprises moving the precursor-gas supply along the substrate by rotating the deposition head while supplying the precursor gas, wherein moving the substrate along the precursor-gas supply comprises moving the substrate along a helical path around the deposition head. The invention further provides an apparatus for depositing an atomic layer on a substrate, the apparatus comprising a deposition head having a precursor-gas supply for supplying a precursor gas towards the substrate, the apparatus further comprising a mount for rotatably mounting the deposition head and comprising a driver arranged for rotating the deposition head so as to move the precursor gas supply along the substrate; said deposition head being constructed for having the supplied precursor gas react near, e.g. on, the substrate so as to form an atomic layer, the apparatus further comprising a guide having a length axis inclined relative to a rotational axis of the deposition head; in such a way as to guide the substrate along a helical path around the deposition head.

The invention is not limited to any embodiment described herein and, within the purview of the skilled person modifications are possible which may be considered within the scope of the appended claims. For example, the term 'substrate' as used herein may refer to a part of a plate or roll that in practice sometimes also is indicated with the term 'substrate': e.g. the expression 'moving the substrate along the precursor-gas supply' as used herein does not require moving the entire plate or roll along the precursor-gas supply; e.g. the expression 'providing the substrate at least once around the deposition head' does not require that the whole plate or roll is moved around the deposition head.

As yet another example, the translational velocity of the precursor-gas supply (e.g. indicated by arrow 62 in FIGS. 11A and 11B) may be directed transverse to the translational velocity of the substrate (e.g. indicated by arrow 60 in FIG. 11A) when the precursor-gas supply is located adjacent to the substrate. Hence, the axis of rotation 91 of the deposition head may be aligned with the moving direction 60 of the substrate, as shown in FIG. 11A. An angle between the moving direction 60 of the substrate and the axis of rotation 91 of the deposition head 6 may be in a range from 0 degrees to 90 degrees.

A variation of the example of FIG. 11A is described with respect to FIG. 11B, which shows the deposition head in a viewing direction along the axis of rotation 91 of the deposition head 6. The variation of FIG. 11B differs from the example of FIG. 11A in that the substrate 4 is wrapped around the deposition head 6.

With reference to FIG. 4, it is noted that the foil 4 traverses only a part of the drum 5 circumference. In the non-traversed bottom part between the rollers 14, the two gaseous reactants (e.g. Al-precursor tri-methyl aluminum and water vapor) may no longer be separated and be mutually exposed, thus forming an aerosol ("powder"). This particle formation may obstruct the product quality, the process, and the R2R equipment. This is partly overcome in an embodiment with a helical scan foil motion over the drum (FIG. 8), but may be improved where the 'screening' of the drum between the foil's roll-off and roll-on zones is not 100% complete.

The cover 16 to prevent any particle (dust') formation may have limitations, as it forms a discontinuity in the gas flow, where both precursors can yield Al2O3 particle formation. In addition, this enclosure may partially act as a substrate for ALD and CVD of Al2O3 which can result in a narrowing gap between the cover and the drum. This may disturb the control of the drum rotation and thus the machine operation.

To further prevent undesired particle formation, there may be provided a switchable flow interruption valve system. Examples of such a system are provided e.g. with reference to the following FIGS. 12-18.

FIG. 12 shows a schematic cross section of an apparatus 2 for depositing an atomic layer onto a substrate 4. The deposition process comprises supplying a precursor gas from a precursor-gas supply 8 comprised by a deposition head towards the substrate and having the precursor gas react near, e.g. on, the substrate so as to form an atomic layer. The deposition head is comprised in a rotatable drum 5 and the substrate 4 is moved along an, at least partly rounded, circumference of the drum 5.

The deposition head comprised in the drum 5 has an output face that at least partly faces the substrate 4 during depositing the atomic layer. The output face is provided with the precursor-gas supply 8 and has a substantially rounded shape defining a movement path of the substrate 4. In particular the precursor-gas supply 8 is moved along the substrate 4 by rotating the deposition head comprised in the rotatable drum 5 while supplying the precursor gas. Thus a stack of atomic layers is deposited while continuously moving the precursor-gas supply in one direction along a rotation trajectory 62.

The apparatus 2 switches between supplying the precursor gas from the precursor-gas supply 8 towards the substrate over a first part of the rotation trajectory T1 and interrupting supplying the precursor gas from said precursor-gas supply 8 over a second part of the rotation trajectory T2.

It is noted that the substrate 4 does not cover the entire surface of the drum 5. Over the first part T1 of the rotation trajectory the substrate 4 may be in proximity to the output face of the drum 5 for depositing the atomic layer while over the second part T2 of the rotation trajectory the substrate is removed or away from the output face. Thus the said switching may prevent leakage of the precursor gas over the second part T2 of the rotational trajectory. Such leakage may otherwise e.g. result in an undesired reaction of the precursor outside of the designated areas on the substrate.

Said interrupting may be provided by redirecting or switching off a precursor gas flow through the precursor gas supply. This may prevent a leakage of the precursor gas over the second part T2 of the rotation trajectory 62. The gas supply 8 may e.g. receive gas from a gas source (not shown here) and the switching between supplying and interrupting the precursor gas supply may be provided by controlling one or more valves arranged in a gas flow path between the gas supply 8 and the gas source when the precursor gas supply 8 rotates from the first to the second part of the rotation trajectory (between T1 and T2).

In the currently shown embodiment, a gas switching structure 103 is formed by electromechanically controlled valves that can be opened and closed by valve control means (e.g. a controller 101). The valves are arranged in the gas flow path of the precursor gas supplies 8 and the reactant gas supplies 42. The valve control means, in this case controller 101, is arranged to close the valves during the second part T2 of the rotational trajectory, at least at positions where the substrate 4 does not cover the gas supplies 8 and/or 42. Likewise the controller 101 may open the valves when the substrate 4 again covers the output face of the drum 5 over the first part T1 of the rotation trajectory 62, i.e. when leakage may prevented by the substrate covering the precursor gas supply 8. Besides valves blocking the ejection of gas, other gas switching structures are possible for affecting the gas flow through the gas flow path. For example, the gas flow may also be redirected by opening an exhaust channel that connects to the gas flow path. Also other means for controlling the gas flow are possible, e.g. by a groove structure acting as a valve system as will be described later with reference to FIGS. 15-18.

In the currently shown embodiment of FIG. 12, there is further provided a reactant gas supply 42. The reactant gas, supplied by the reactant gas supply 42, may e.g. react with the precursor gas deposited on the substrate 4 by the precursor gas supply 8 to form an atomic layer. E.g. the precursor gas may comprise tri-methyl aluminum (TMA) while the reactant gas may comprise water vapor to form an atomic layer of aluminum oxide on the substrate. Similar as the precursor gas supplies 8, the reactant gas supplies 42 may be provided with valves that may close, e.g. under control of the valve controller to prevent an escape of the reactant gas from the apparatus 2, e.g. at parts T2 of the rotation trajectory 62 where the substrate 4 does not cover the output face of the drum 5. Alternatively, the valves may be provided only for the precursor gas, e.g. if the escaping reactant gas is not objectionable, e.g. in the case of water vapor.

In the current embodiment of FIG. 12, the drum 5 further comprises an arrangement of purge gas supplies 38 and purge gas drains 40a and 40b that separate the precursor gas supplies 8 and the reactant gas supplies 42. The purge gas drains 40a and 40b may also be used to drain the precursor gas and the reactant gas, respectively, in separate channels. The purge gas may form a gas curtain between the precursor gas and reactant gas that prevents undesired reaction between the two gasses outside of the designated areas on the substrate 4.

Preferably, the valves are provided in close proximity to the output face of the precursor gas supplies. In this way, the amount of dead space wherein precursor gas may remain is limited. Alternatively, if the exhaust point provides sufficient resistance to the gas flow, e.g. by a narrow opening, the valves may be placed further upstream to release a precursor gas pressure and the gas flow out of the precursor gas supplies is effectively halted. Alternatively or in addition to closing a valve to stop the supply of precursor gas, an exhaust valve may open up to remove any remaining precursor gas in a dead space between the closed valve and the output face of the precursor gas supply.

It is noted that a problem of undesired leakage of precursor gasses may also be partly solved by wrapping the substrate around the drum in a helical fashion as shown in FIG. 8. Preferably, the precursor gas supplies are switchable between an open and closed state such that at positions where the substrate leaves the drum, the precursor gas supplies are closed to prevent leakage of the precursor gas at these positions.

FIG. 13 shows a schematic cross section of a drum 5 that rotates around an e.g. static central axle 10. Precursor gas supplies 8 comprised in an output face of the drum receive precursor gas via a gas flow path 155 that runs via a circumferential groove 57*a* in the axle 10 while gas inlets 8*i* are opposite the groove 57*a* in a first part T1 of the rotational path 62. During a second part T2 of the rotational path 62, the gas inlets 8*i* pass an obstruction 103' forming an end in the groove of the axle 10 that acts as a gas switching structure to obstruct the gas flow path 155 during the second part of the trajectory T2. In this way, gas is prevented from escaping the gas supplies 8 during the second part T2 of the rotational path 62, corresponding at least to the part of the drum 5 that is not covered by the substrate 4.

As shown in the figure, the substrate 4 does not cover the exhaust points of the gas supplies 8 in the bottom part of the drum 5 between the rollers 14*a* and 14*b*. Preferably, the obstructions 103' defining T2 are provided such that a gas supply 8 is interrupted well before the substrate 4 leaves the corresponding exhaust point of the said gas supply 8 and turned back on well after the substrate meets again the said exhaust point to prevent the undesired escape of gasses, e.g. from a dead space of the precursor gas supply. Additionally or alternatively, a second groove 57*b* may be provided in the axle 10 that is connected to a gas drain (not shown). In this way excess gasses remaining in the dead space of the gas supplies 8 may be drained or at least prevented from escaping when the supplies 8 rotate along the second part T2 of the rotational trajectory 62 thus further preventing the undesired leakage of precursor gas.

FIG. 14 shows another embodiment of the apparatus 2 wherein another gas switching structure 103 is provided. The gas switching structure 103 is formed by a magnetic valve 101*b* that is arranged to slide in and out of a corresponding opening or valve seat 101*c* under control of a valve switching means formed by control magnets 101*a* that are arranged along a rotational path traversed by the magnetic valve 101*b*. The gas switching structure 103 is arranged in the gas flow path 155 for switching between supplying the precursor gas from the precursor-gas supply towards the substrate over a first part of the rotation trajectory T1 and interrupting supplying the precursor gas from said precursor-gas supply over a second part of the rotation trajectory T2. Views (A), (B), and (C) show a zoom-in of a magnetic valve system, a view of a control magnet arrangement, and a resulting direction of magnetic field lines, respectively.

Accordingly, in an embodiment the gas switching structure 103 comprises valves 101*b* and valve control means 101*a*, wherein the valves 101*b* are arranged for affecting the gas flow through the gas flow path 155; and the valve control means 101*a* are arranged for controlling the valves 101*b* to interrupt the gas flow to the gas supply over the second part T2 of the rotation trajectory 62. In the current embodiment the valves 101*b* comprise valve magnets and the valves 101*b* are arranged for switching between an open and closed state depending on a polarity of an external magnetic field applied to the valve magnets. The valve control means 101*a* comprise control magnets arranged along a stationary path of the rotation trajectory with an opposite magnetic polarity between the first and second parts of the rotational trajectory as shown in view (B).

This reversed polarity results in magnetic fields 101*f* shown in view (C) that point in the opposite direction for the first and second parts of the rotational trajectory 62. E.g. in the first part T1, the control magnets along the rotational trajectory are pointing with one polarity towards the magnetic valves for attracting the magnet therein which faces the control magnets with one polarity. By this attracting force in this case the valve is opened and the gas flow path is opened up. Similarly, when the control magnets in the second part T2 of the rotational trajectory 62 are facing the valve magnets with an opposite polarity, the magnetic repulsion may close the valve. In this way the valves may be switched between the open and closed states when the precursor gas supply (not shown here) passes a transition between the first and second parts of the rotational trajectory 62. It is noted that while a radial magnetic field is shown here, alternatively, the magnetic field may also be e.g. in a tangential direction or any other direction switching between polarities.

Additionally or alternatively to the shown embodiment, the valves 103 may also be opened or closed under the influence of gravitational forces. E.g. when the valve is in the bottom part of the drum, the valve may fall down and close the gas flow path and open up again as the drum rotates the valve upwards. This gravitational valve may employ e.g. also a system of springs and weights that are adjusted to open and close the valves at the desired parts of the rotational trajectory.

In an embodiment, of a combined magnetic/gravitational actuation valve a permanent magnet may open the valve in a horizontal position (in a first part of the trajectory T1) while in the critical part (the second part of the trajectory T2), gravitation may take over and close the valve. In this embodiment, e.g. magnets are provided only over the first part of the rotational trajectory T1. It is noted that in general the closing valve position is preferably close to the reaction chamber, to minimize dead volumes with precursor gas. Note, that also this dead volume can be evacuated by an extra switchable exhaust line.

In an embodiment a ball-shaped or otherwise shaped closing element of metal, preferably a permanent magnetic material, etc., may be inserted in the individual radial supply lines that can interrupt the gas flow once it nears the critical roll-off zone (T2). In a simple form the on-off "actuation" can be by utilizing the earth's gravitational force: when a radial gas supply line in the rotating drum rotates into the critical roll-off zone T2 the gravitation force will draw the ball over a certain threshold into the closed-off position, until it leaves the critical zone.

Another embodiment may be that of a closing element with local external magnetic force, actuated by an inductive coil, to keep the supply line in its "open" position in its trajectory along the foil, and to switch to its "off" position by reversing the electric current through the coil.

Another option here is to insert an extra exhaust line ("shunt or bypass") that can be opened in the "foil roll-off" segment. This case has the advantage of a continuous precursor gas flow (no pressure drop).

FIG. 15 shows an exploded view of an apparatus 2 wherein the gas supplies 8, 38, and 42 are comprised in a drum 5 that receives gas from a gas source (not shown here) via a sealing piece 55 that seals at least part of the drum's surface. In the current view only one sealing piece 55 is depicted to show the gas inlets 58*a* in the inner drum 51 on the front side.

In use, the sealing piece 55 will be kept pressed sealingly against the drum 5 to seal the grooves 57 between the sealing piece and the drum surfaces thus forming gas flow channels. The sealing piece 55 and the drum 5 thus form a sealing structure comprising the gas flow channels. The drum 5 is rotatable with respect to the sealing piece 55 and comprises one or more gas inlets 58. The sealed grooves 57 are arranged such that they lie opposite the gas inlets 58 over a first part of the rotation trajectory thus forming a part of the gas flow path. In particular the grooves are connected to a gas outlet (not shown) that provides gas flow from the gas source through a channel formed by the sealed grooves. On positions where the grooves 57 lie opposite the gas inlets 58, the gas may flow from the gas outlets of the sealing piece via the sealed grooves into the gas inlets of the drum.

Another aspect illustrated by the current FIG. 15 is a preferred layout of the gas supplies 8, 38, 42 in the drum 5. In particular, precursor gas supplies 8 are preferably alternated with reactant gas supplies 42 separated by purge gas supplies 38. The deposition heads of the respective gas supplies 8, 38, 42 are slit-shaped, e.g. with a width of 0.1 mm. Through the slit-shaped deposition heads of the gas supplies 8, 38, 42 gasses may flow in a controlled fashion to a substrate (not shown) that may cover part of the drum's surface (see e.g. FIG. 13). The said narrow slit may be formed between exchangeable insert halves 61 that are connected to the drum with recessed connection pieces 63. The insert halves 61 form an outer part 53 of the drum comprising the deposition heads of the gas supplies.

A typical outlet gap formed by the insert halves 61 is 0.1 mm in width. A typical insert length is 250 mm for the precursor outlets and 280 mm for the N$_2$ inserts. The outer surface of the insert strips is preferably smooth to ensure an equal gas distribution over the insert length. The pneumatic restriction of the outlet gap is preferably much higher than the resistance of the divider chamber to obtain a homogeneous flow rate towards de reactant/bearing zone. A homogeneous flow rate is preferred to obtain a homogeneous bearing of the web/homogeneous deposition of precursor gasses.

Each gas supply is formed by two insert halves 61 that are positioned against each other e.g. with dowel pins and connected e.g. by M3 hexagon screws. By providing a U-shaped or concave profile in each insert half a divider chamber 61a is created beneath the gas outlet. A continuous outlet width over the entire foil size is desired to obtain uniform concentration and accurate gas separation. Also, smooth outer surface for equal distribution over width.

The connection pieces 63 are themselves screwed or bolted to the inner drum 51 via screw holes 63a. The connection pieces 63 may thus form recessed troughs in the drum and comprise gas drain channels 67 through which excess purge gasses and precursor or reactant gas may be removed via the troughs formed between the substrate and drum.

The combination of a suction force of the drains 67 in the recessed channels formed by the connection pieces 63 and a pressure provided by the purge and other gas supplies may be balanced to keep a substrate (not shown) at a desired distance from the drum during deposition of the atomic layers on the substrate. The purge gas supplies may thus function both as a gas curtain between the precursor and reactant gasses as well as a gas bearing for the substrate. The precursor and/or reactant gas can also have a bearing function. Preferably also a circumferential purge gas supply 38' is provided with purge gas to prevent an undesired leakage of precursor and/or reactant gasses. In addition, as will be shown with more detail in FIG. 16, the grooves 57 may be arranged such that a gas supply to the drum is interrupted or redirected when the said gas supply traverses a part of the rotational trajectory where the drum surface is not covered by the substrate.

FIG. 16 shows an exploded view of a sealing structure 95 formed by a stationary sealing piece 55 that is to be connected to a rotatable feed through plate 59 of a drum 55. It is noted that the sealing structure may act as both a gas transition structure for providing gas from stationary sources 108', 138', 142' to the rotating drum 5 as well as a gas switching structure for interrupting and resuming the gas flow. The sealing piece 55 comprises circumferential grooves 57 that lie opposite corresponding gas inlets/outlets in the feed-through plate 59. The grooves 57 in combination with the gas inlets/outlets 58 may form a valve 103 that opens as a function of a relative rotation of the drum 5 with respect to the sealing piece 55. The drum may rotate around an axle 10 that may rest on a bearing structure that may be formed e.g. by an inner cavity of the sealing piece 55 or externally. The axle 10 may be driven e.g. by a motor (not shown), preferably a heat resistant motor (e.g. brushless DC motor). The motor may connect directly to the drum axle 10 or e.g. via a gear box to increase torque of the motor In use, the grooves 57 run between the surfaces of the sealing piece 55 and the rotating feed-through plate 59 comprised in the drum 5. The grooves 57 corresponding to a first part T1 of the rotational trajectory 62 of the drum may be provided with precursor gas 108, purge gas 138, and reactant gas 142 from respective gas sources 108', 138', and 142'. In addition, the grooves corresponding to a second part T2 of the rotational trajectory 62 of the drum may be connected to gas drains (not shown). In such an arrangement, when the gas inlets/outlets 58 are opposite the grooves connected to the gas sources 108', 138', or 142', the gas supplies of the drums may supply the respective gasses to a surface of the substrate (not shown), during the first part of the rotational trajectory T1 when the output face of the drum is in proximity to the substrate. In addition, when the substrate is away from the drum's surface, the gas supplies of that part of the surface of the drum 5 may be interrupted and/or the gasses may be drained to prevent an undesired leakage of the precursor and/or reactant gasses to an external environment.

Accordingly, in the shown embodiment, the circumferential sealed grooves 57 extend along the first part T1 of the rotation trajectory 62, ending between the first and second parts T1 and T2 of the rotation trajectory 62 in such a way that during interrupting supplying the precursor gas from said precursor-gas supply over the second part T2 of the rotation trajectory, the gas flow path that runs via the grooves 57 is interrupted by a surface of the drum, in particular the feed-through plate 59 in this case.

Alternative to the shown embodiment, the grooves may be provided in the drum 5 and gas inlets/outlets in the sealing piece 55. Also, while the currently shown sealing piece 55 comprises a plate that seals a side of the drum, alternatively, the sealing piece may seal a circumference of the drum wherein the grooves are provided along the circumference of either the drums surface of the sealing piece. Also combinations of these side-sealing and circumferential sealing pieces are possible. Furthermore also the drum 5 and sealing piece 55 may both comprise grooves or a combination of exhaust channels and grooves. Furthermore, while in the current embodiment, the grooves are shown as having a certain depth, this depth may also be varied along the groove length.

While in the current embodiment only three grooves are shown, this number may be expanded or reduced to fit the particular needs of the deposition process. In an advantageous embodiment, grooves carrying precursor gasses are surrounded by grooves carrying purge gas at a higher pressure than that of the precursor gasses. In this way the purge gas may form a gas curtain between the precursor gas and the external surroundings e.g. similar as was discussed in connection with the concentric tubes of FIG. 1E. Alternatively or in addition, grooves may be provided with alternating precursor gas 108 and reactant gas 142 supplies separated by grooves with purge gas 142 supplies and gas drains, e.g. in a sequence from the center outward: precursor gas supply, gas drain, purge gas supply, gas drain, reactant gas supply, gas drain, purge gas supply. In this way the precursor gas together with the purge gas is drained in a separate drain channel from the reactant gas with the purge gas.

Alternatively or in addition, precursor gasses may be supplied through a sealing piece on one side of the drum while reactant gasses are supplied on another side of the drum. One or both sides may be provided with purge gas curtains to prevent the undesired escape of precursor/reactant gasses to an external surroundings. The sealing piece 55 can also have a gas bearing to the (axial) drum side.

FIG. 17 shows a schematic cross section gas connections between a sealing piece 55 to a drum 5. The drum 5 is rotatable with respect to the sealing piece 55 over a rotational trajectory 62, driven e.g. by a motor M via an axle 10 that rotates in bearings 12.

The drum comprises precursor gas supplies 8 (e.g. TMA), purge gas supplies 38 (e.g. $N_2$), reactant gas supplies 42 (e.g. water vapor) and gas drains 40a and 40b on an output face of the drum 5. The gas supplies 8, 38, 42 receive gas 108, 138, 142 from respective gas sources 108', 138', 142' via a sealing piece 55 that seals at least part of the drum's surface. Thereto the drum 5 comprises gas outlets/inlets 58 while the sealing piece 55 comprises circumferential grooves 57 in its surface. In other words the grooves 58 follow a tangential path with a radius (distance to the center) corresponding to that of the inlets/outlets 58. In an embodiment, the purge gas lines may be designed in axial direction for gas bearing and separation of the reactant gases, as well in radial direction for bearing the drum extremes.

The grooves 57 are sealed by the drum 5 and arranged such that they lie opposite the gas outlets/inlets 58 over at least a part of the rotation trajectory 62. In use, a part of the sealed grooves 57 may form part of a gas flow path between the gas sources 108', 138', 142' and the gas supplies 8, 38, 42. Furthermore, other sealed grooves 57 or another part of the sealed grooves 57 may form part of another gas flow path between the gas drains 40a, 40b and the respective gas sinks 140a', 140b' for draining excess precursor gas 8 and reactant gas 42, respectively. Preferably the drain channels for precursor gas 108 and reactant gas 142 are kept separate such that no undesired reaction occurs between the precursor gas and the reactant gas at non-designated areas (i.e. not on the substrate). As was discussed above, alternative to the shown embodiment, the grooves 57 and gas inlets/outlets 58 may be reversed between the sealing piece 55 and the drum 5 or be mixed in any combination.

In an embodiment the circumferential sealed grooves extend along a first part of the rotation trajectory 62, ending between the first and a second part of the rotation trajectory 62 in such a way that during interrupting supplying the precursor gas from the precursor-gas supply 8 over the second part of the rotation trajectory 62, the gas flow path is interrupted by a surface of the drum 5. In this way the relative rotation of the drum with respect to the sealing piece opens and closes a gas flow path between the gas sources/sinks and the respective gas supplies/drains, i.e. the combined structure acts as a valve system. The grooves may thus act as valves wherein the rotation of the drum acts as a means for controlling the valves.

The gas feed-through plates or sealing piece 55, may have several functions:
  Connect to the nitrogen inserts and create a nitrogen slit in circumferential direction
  Serve as an axle to bear the drum in conventional or air bearings
  Provide a larger diameter at the outer edge to fit a feed-through plate e.g. with a typical diameter of 220 mm.
  Provide the holes to feed gases through.
  Serve as an axial (gas) bearing for the drum.

Each chamber/insert is preferably connected with a single radial bore. The outlet chambers may have two bores each. The axial bores serve to connect to the feed-through plate. The bores may e.g. have a diameter of typically 6 mm. The radial bores can be e.g. at a distance close to the extreme sides of the drum to minimize the channel volumes and dead space.

In an embodiment, the drum 5 can be carried by standard air bushings of porous carbon, and be fixed in axial direction by a flat round air bearing. The drum can be driven by a heat resistant motor M (e.g. brushless DC motor) that connects directly to the drum axle 10 with a gearbox in between to increase torque of the motor.

FIG. 18 shows another embodiment of the apparatus 2. The current embodiment of the apparatus 2 comprises two sealing pieces 55a, 55b on either side of the drum 5. The drum is rotatable with respect to the sealing pieces 55a, 55b over a rotational path 62, e.g. rotating around an axle 10 that runs in a bearing 12. The first sealing piece 55a is arranged for supplying precursor gas 108 and purge gas 138 to the drum 5 as well as draining excess purge and/or precursor gas 140b from the drum. The second sealing piece 55b is arranged for supplying reactant gas 142 to the drum 5 as well as draining excess reactant gas 140b from the drum 5. An advantage of supplying and/or draining the precursor gas 108 and the reactant gas 142 via two separate sealing pieces 55a and 55b, respectively, is that the two gasses 108 and 142 will be prevented from meeting each other e.g. via leaky openings in the sealing piece and reacting at places outside the designated areas. Another advantage may be a smaller spatial claim in the drum design.

In an embodiment there is provided, a switched gas supply line configurations with flow interrupters or resistors fully integrated in a coaxial dual drum set for use in a roll-to-roll ALD system, wherein interruption is done by valves and/or gas feed-through and gas bearing/separation system fully integrated in a force-controlled or shape-controlled configuration.

The application fields for the present disclosure are not limited to ALD but may extend e.g. for reel-to-reel deposition equipment for large area manufacturing of barrier layers for OLED, organic photo-voltaics, flexible organic electronics (e.g. transistors), passivation and buffer layers thin-film solar cells, moist and oxygen diffusion barrier layers in (food) packaging, etc. and is not limited to the production of $Al_2O_3$ alone. The deposition of other materials (ZnO, etc.), is also envisaged.

Equally all kinematic inversions are considered inherently disclosed and to be within the scope of the present invention. The use of expressions like: "preferably", "in particular", "especially", "typically" etc. is not intended to limit the invention. The indefinite article "a" or "an" does not exclude a plurality. Features which are not specifically or explicitly described or claimed may be additionally comprised in the structure according to the present invention without deviating from its scope. For example, the deposition head may be provided with a heater for realizing an elevated temperature, for example near 220° C., of a part of the substrate during atomic layer deposition on that part of the substrate. As another example, the apparatus may be provided with a pressure controller for controlling gas pressure in the cavity, in the precursor-gas supply, the precursor-gas drain, the reactant-gas supply, the reactant-gas drain, the bearing-gas supply, and/or the precursor-gas drain. The pressure controller may comprise the gas controller. Furthermore, the apparatus may e.g. comprise a micro-plasma source or another source suitable for enhancing the reactivity of the precursor-gas material during deposition on the substrate or for post-deposition treatment after deposition on the substrate. It may be clear that, in addition to or alternative to rotating the deposition head, reciprocating the deposition head may provide valuable deposition options.

The invention claimed is:

1. Apparatus for depositing a plurality of atomic layers on a substrate, the apparatus comprising
a deposition head configured for rotating through a rotation trajectory, the deposition head having an output face configured to at least partly face the substrate and supply a precursor gas to the substrate via a precursor gas supply, wherein the output face has a substantially rounded shape defining a movement path of the substrate, the apparatus configured to deposit the plurality of atomic layers during movement of the substrate through the apparatus, the apparatus further comprising
a transporter configured to transport the substrate towards and away from the deposition head, wherein the transporter is configured for moving the substrate towards the deposition head at a first position, and wherein the transporter is configured for moving the substrate away from the deposition head at a second position, to thereby define a first part of the rotation trajectory where the precursor gas supply faces the substrate and a second part of the rotation trajectory where the precursor gas supply does not face the substrate;
a gas switching structure configured for switching between
supplying the precursor gas through the precursor gas supply to the substrate in those parts of the output face that, during said rotating, are located in the first part of the rotation trajectory, and
interrupting supply of the precursor gas through the precursor gas supply in those parts of the output face that, during said rotating, are located in the second part of the rotation trajectory.

2. Apparatus according to claim 1, wherein the deposition head is comprised by a drum, wherein the gas switching structure comprises a circumferential groove disposed in a surface of the drum or in an opposing surface of a sealing piece configured to
seal at least part of the drum's surface, wherein
the drum is rotatable with respect to the sealing piece, wherein
one of the drum or the sealing piece, which does not comprise the circumferential groove, comprises an inlet of the precursor gas, and wherein
the circumferential groove is configured for forming a gas flow path from the inlet of the precursor gas, through the output face, and to the substrate over the first part of the rotation trajectory and configured for interrupting the gas flow path over the second part of the rotation trajectory.

3. Apparatus according to claim 2, wherein an end of the circumferential groove between the first and second part of the rotation trajectory is configured to cause the interrupting of the gas flow path over the second part of the rotation trajectory, wherein a surface at the end of the circumferential groove acts as a valve system.

4. Apparatus according to claim 1, wherein the gas switching structure comprises
valves configured for switching between an open and a closed state depending on an external magnetic field applied to valve magnets; and
control magnets arranged along the rotation trajectory and configured to provide a first magnetic polarity over the first part of the rotation trajectory for opening the valves to form a gas flow path of the precursor gas through the output face and to the substrate, the control magnets further configured to provide a second, opposite magnetic polarity over the second part of the rotation trajectory for closing the valves and interrupting the gas flow path.

5. Apparatus according to claim 4, wherein the valves are configured for switching between the open and the closed state depending on the external magnetic field, when applied radially to the valve magnets.

6. Apparatus according to claim 2, wherein the gas switching structure comprises further circumferential grooves disposed in the surface of the drum or in the opposing surface of the sealing plate, wherein the further circumferential grooves are configured for forming gas flow paths from respective inlets of a purge gas and a reactant gas, through the output face, and to the substrate over the first part of the rotation path and configured for interrupting the gas flow paths over the second part of the rotation trajectory.

7. Apparatus according to claim 1, wherein the deposition head is comprised by a drum, wherein the gas switching structure comprises a circumferential groove on a stationary axle disposed centrally with respect to the drum, the circumferential groove configured for forming a gas flow path of the precursor gas through the output face and to the substrate over the first part of the rotation trajectory, and the circumferential groove having an obstructing end over the second part of the rotation trajectory to interrupt the gas flow path.

8. Apparatus according to claim 1, wherein the gas switching structure comprises valves and a controller, wherein a signal from the controller opens the valve over the first part of the rotation trajectory to form a gas flow path of the precursor gas through the output face and to the substrate, and wherein the signal from the controller closes the valve over the second part of the rotation trajectory to interrupt the gas flow path.

9. Apparatus according to claim 2, wherein the gas switching structure comprises valves configured for switching between an open and a closed state depending on a direction of gravity relative to the valves, and wherein the direction of gravity over the first part of the rotation trajectory opens the valves to form a gas flow path of the precursor gas through the output face and to the substrate, and wherein the direction of gravity closes the valves over the second part of the rotation trajectory to interrupt the gas flow path.

10. Apparatus of claim 1, wherein the output face comprises a plurality of precursor gas supplies, and wherein for each respective precursor gas supply the gas switching structure is configured for switching between: supplying the precursor gas through the respective precursor gas supply to the substrate over a first part of the rotation trajectory where the respective precursor gas supply faces the substrate, and interrupting supply of the precursor gas through the respective precursor gas supply over a second part of the rotation trajectory where the respective precursor gas supply does not face the substrate.

11. Method of depositing a plurality of atomic layers on a substrate, the method comprising using the apparatus of claim 1 for
supplying the precursor gas through the output face via the precursor gas supply to the substrate, wherein the precursor gas is supplied from a gas source,
having the precursor gas react near, or on the substrate so as to form the plurality of atomic layers; by
rotating the deposition head along the rotation trajectory while supplying the precursor gas through the output face; and
switching between
supplying the precursor gas through the precursor gas supply to the substrate over the first part of the rotation trajectory where the precursor gas supply faces the substrate; and
interrupting supply of the precursor gas through the precursor gas supply over the second part of the rotation trajectory where the precursor gas supply does not face the substrate.

12. Method according to claim 11, wherein
over the first part of the rotation trajectory the substrate is in proximity to the output face for the depositing the plurality of atomic layers;
over the second part of the rotation trajectory the substrate is removed or away from the output face; and
said interrupting is provided by redirecting or switching off a precursor gas flow through a precursor gas supply to prevent a leakage of the precursor gas over the second part of the rotation trajectory.

13. Method according to claim 11, wherein the gas switching structure comprises a circumferential groove disposed in a surface of the drum or in an opposing surface of a sealing piece that
seals at least part of the drum's surface, wherein
the drum rotates with respect to the sealing piece, wherein
one of the drum or the sealing piece, which does not comprise the circumferential groove, comprises an inlet of the precursor gas, and wherein
during supplying the precursor gas through the output face to the substrate, the circumferential groove forms a gas flow path from the inlet of the precursor gas, through the output face, and to the substrate.

14. Method according to claim 13, wherein an end of the circumferential groove between the first and second part of the rotation trajectory causes the interrupting of the gas flow path over the second part of the rotation trajectory, wherein a surface at the end of the circumferential groove acts as a valve system.

15. Method according to claim 11, wherein the gas switching structure comprises
valves that switch between an open and a closed position, depending on an external magnetic field applied to the valves, and the method further comprises
providing a first magnetic polarity over the first part of the rotation trajectory that opens the valves to form a gas flow path of the precursor gas through the output face and to the substrate, and providing a second, opposite magnetic polarity over second part of the rotation trajectory that closes the valves and interrupts the gas flow path.

16. Method according to claim 11, wherein a precursor gas supply is contained in a drum, which receives gas from a stationary gas source via a gas flow path formed by relative rotating parts; wherein a leakage of the precursor gas through an opening between the relative moving parts is prevented by a purge gas provided around said opening having a higher pressure than the precursor gas.

17. Method according to claim 16, wherein the relative rotating parts comprise two or more concentric tubes wherein the precursor gas is fed through an inner tube and the purge gas is fed through an outer tube.

18. Method according to claim 16, wherein the purge gas is further used as a bearing gas for the drum.

19. Method according to claim 16, wherein the purge gas is further used as a gas curtain between the precursor gas supply and at least one more precursor gas supply.

* * * * *